US012751322B2

(12) United States Patent
Fang et al.

(10) Patent No.: US 12,751,322 B2
(45) Date of Patent: Sep. 29, 2026

(54) DISPLAY PANEL AND DISPLAY DEVICE

(71) Applicant: Xiamen Tianma Microelectronics Co., Ltd., Xiamen (CN)

(72) Inventors: Liting Fang, Xiamen (CN); Xiaofen Chen, Xiamen (CN); Wei Wang, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 516 days.

(21) Appl. No.: 18/140,683

(22) Filed: Apr. 28, 2023

(65) Prior Publication Data

US 2023/0268324 A1 Aug. 24, 2023

(30) Foreign Application Priority Data

Dec. 15, 2022 (CN) ......................... 202211615711.0

(51) Int. Cl.
*H10W 90/00* (2026.01)

(52) U.S. Cl.
CPC .................................... *H10W 90/00* (2026.01)

(58) Field of Classification Search
CPC . H01L 25/0753; H01L 25/167; H10K 59/353; H10K 59/352; H10W 90/00; H10H 29/142
See application file for complete search history.

(56) References Cited

U.S. PATENT DOCUMENTS 11,862,080 B2 * 1/2024 Tseng .................. G09G 3/2096
11,982,951 B2 * 5/2024 Wang ............... G03G 15/04036
12,342,704 B2 * 6/2025 Fukuoka .............. H10K 50/852
12,394,761 B2 * 8/2025 Wang .................. G09G 3/3225
2016/0064363 A1 * 3/2016 Bower .................. H05B 45/60 257/40
2017/0193926 A1 * 7/2017 de Greef .............. G09G 3/2011
2020/0212269 A1 * 7/2020 Akimoto ................ G09G 3/006
2023/0074299 A1 * 3/2023 Wang ............... G03G 15/04036
(Continued)

FOREIGN PATENT DOCUMENTS

CN 103531152 B * 5/2016
CN 109036257 A * 12/2018 ........... G09G 3/3266
(Continued)

*Primary Examiner* — Laura M Menz
(74) *Attorney, Agent, or Firm* — KDW FIRM PLLC

(57) ABSTRACT

Provided are a display panel and a display device. The display panel includes a substrate and multiple display units located on a side of the substrate. The display units include multiple light-emitting elements. The light-emitting elements include main light-emitting elements and backup light-emitting elements. The number of main light-emitting elements is greater than the number of backup light-emitting elements. The main light-emitting elements are arranged in a first direction. In a second direction, a backup light-emitting element is located between two main light-emitting elements. In the second direction, at least two main light-emitting elements are disposed adjacent to each other. When the display panel is driven to display an image, and when a dead pixel appears in a main light-emitting element, a backup light-emitting element emits light to replace the main light-emitting element in which the dead pixel appears for display.

19 Claims, 18 Drawing Sheets

(56) References Cited

U.S. PATENT DOCUMENTS

| | | | | |
|---|---|---|---|---|
| 2023/0169916 | A1* | 6/2023 | Tseng | G09G 3/2096<br>345/694 |
| 2023/0268324 | A1* | 8/2023 | Fang | H10K 59/353<br>257/89 |
| 2024/0005855 | A1* | 1/2024 | Chi | G09G 3/32 |
| 2025/0301840 | A1* | 9/2025 | Teng | H10H 29/34 |
| 2025/0349268 | A1* | 11/2025 | Wyatt | C09K 11/00 |

FOREIGN PATENT DOCUMENTS

| | | | | | |
|---|---|---|---|---|---|
| CN | 112164704 | A | * | 1/2021 | H10W 90/00 |
| CN | 112233609 | A | * | 1/2021 | G09G 3/3607 |
| CN | 112820202 | A | * | 5/2021 | G09F 9/33 |
| CN | 213124443 | U | * | 5/2021 | |
| CN | 109036257 | B | * | 4/2022 | G09G 3/2003 |
| CN | 112164704 | B | * | 9/2022 | H10W 90/00 |
| CN | 112820202 | B | * | 3/2023 | G09F 9/33 |
| CN | 116111025 | A | * | 5/2023 | H10W 90/00 |
| CN | 116189610 | A | * | 5/2023 | G09G 3/3208 |
| CN | 116568094 | A | * | 8/2023 | H10W 90/00 |
| CN | 117995863 | A | * | 5/2024 | H10H 29/142 |
| CN | 118524751 | A | * | 8/2024 | H10K 59/95 |
| CN | 119095440 | A | * | 12/2024 | G09F 9/33 |
| CN | 114497150 | B | * | 8/2025 | H10K 59/353 |
| CN | 120224986 | B | * | 10/2025 | H10K 59/873 |
| JP | 2020106745 | A | * | 7/2020 | H10P 74/23 |
| JP | 2021504752 | A | * | 2/2021 | H10W 90/00 |
| JP | 7138286 | B2 | * | 9/2022 | H10P 74/23 |
| JP | 7345469 | B2 | * | 9/2023 | H10W 90/00 |
| KR | 20220012997 | A | * | 2/2022 | H10H 20/851 |
| KR | 20230097948 | A | * | 7/2023 | H10H 20/856 |
| KR | 20230115893 | A | * | 8/2023 | H10W 90/00 |
| KR | 102779785 | B1 | * | 3/2025 | H10W 90/00 |
| WO | WO-2020210740 | A1 | * | 10/2020 | H10W 90/00 |
| WO | WO-2022252502 | A1 | * | 12/2022 | H10K 59/1213 |

* cited by examiner

DISPLAY PANEL AND DISPLAY DEVICE

CROSS-REFERENCE TO RELATED APPLICATION(S)

This application claims priority to Chinese Patent Application No. 202211615711.0 filed Dec. 15, 2022, the disclosure of which is incorporated herein by reference in its entirety.

TECHNICAL FIELD

The present invention relates to the field of display and, in particular, to a display panel and a display device.

BACKGROUND

Each pixel in a self-light-emitting display panel is configured with a light-emitting element, and a good display effect can be implemented without an additional backlight module. A self-light-emitting display panel is composed of multiple light-emitting elements. When a light-emitting element fails, to avoid affecting the display effect, each light-emitting element is generally configured with a backup light-emitting element, and the backup light-emitting element performs replacement display. However, in the related art, a large number of light-emitting elements are disposed. As a result, the preparation cost and arrangement space of a display panel are seriously affected.

SUMMARY

The present invention provides a display panel and a display device to reduce the number of backup light-emitting elements disposed, ensure the display effect of the display panel, and reduce the manufacturing cost.

In a first aspect, an embodiment of the present invention provides a display panel. The display panel includes a substrate and multiple display units located on a side of the substrate.

The display units include multiple light-emitting elements. The light-emitting elements include main light-emitting elements and backup light-emitting elements. The number of main light-emitting elements is greater than the number of backup light-emitting elements.

The main light-emitting elements are arranged in a first direction. In a second direction, a backup light-emitting element is located between two main light-emitting elements. In the second direction, at least two main light-emitting elements are disposed adjacent to each other.

In a second aspect, an embodiment of the present invention provides a display device. The device includes any display panel described in the first aspect.

BRIEF DESCRIPTION OF DRAWINGS

To illustrate technical solutions in embodiments of the present invention more clearly, the accompanying drawings used in description of the embodiments are briefly described below. Apparently, the accompanying drawings described below illustrate part of embodiments of the present invention, and those of ordinary skill in the art may obtain other accompanying drawings based on the accompanying drawings described below on the premise that no creative work is done.

DETAILED DESCRIPTION

The solutions in embodiments of the present invention are described clearly and completely in conjunction with the drawings in the embodiments of the present invention from which the solutions are better understood by those skilled in the art. Apparently, the embodiments described below are part, not all, of the embodiments of the present invention. Based on the embodiments described herein, all other embodiments obtained by those skilled in the art on the premise that no creative work is done are within the scope of the present invention.

It is to be noted that the terms “first”, “second” and the like in the description, claims and drawings of the present invention are used to distinguish between similar objects and are not necessarily used to describe a particular order or sequence. It should be understood that the data used in this way is interchangeable where appropriate so that the embodiments of the present invention described herein may also be implemented in a sequence not illustrated or described herein. In addition, terms “comprising”, “including” and any other variations thereof are intended to encompass a non-exclusive inclusion. For example, a process, method, system, product or device that includes a series of steps or units not only includes the expressly listed steps or units but may also include other steps or units that are not expressly listed or are inherent to such process, method, product or device.

Figure 1:
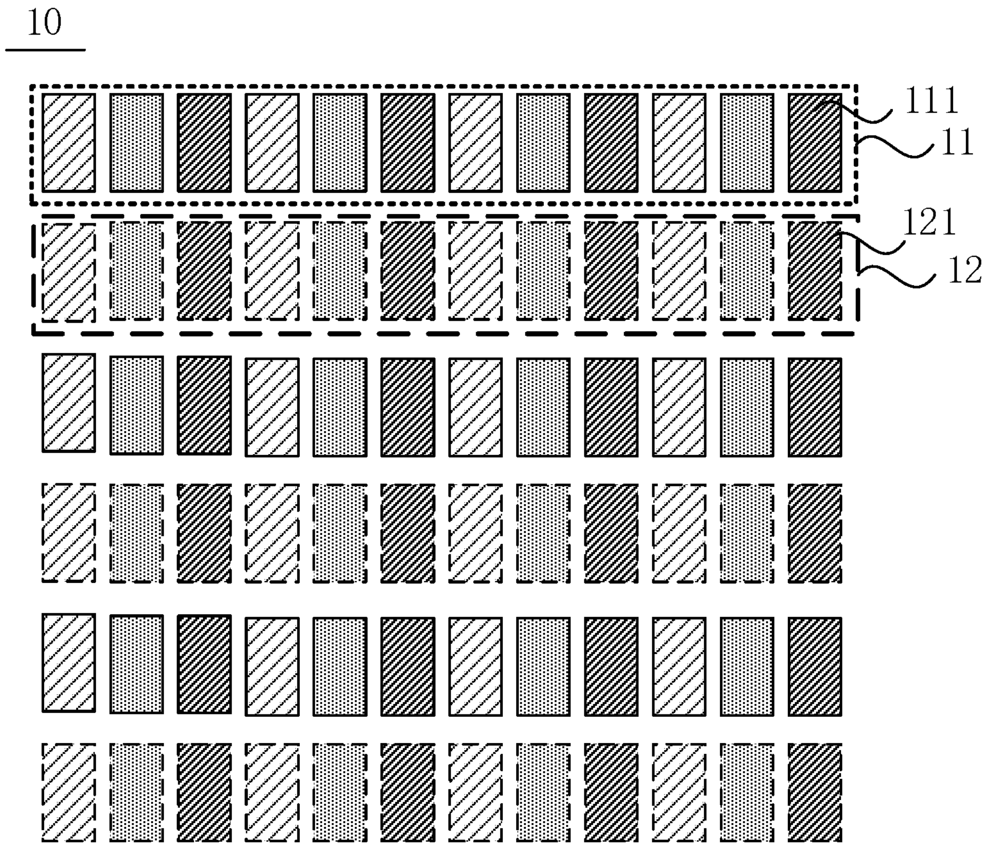
FIG. 1 (Prior Art)
FIG. 1 is a diagram illustrating the structure of a display panel according to the related art.

FIG. 1 is a diagram illustrating the structure of a display panel according to the related art. As shown in FIG. 1, the display panel includes a display region 11 and a backup display region 12. Multiple light-emitting elements 111 are disposed in the display region 11. Multiple backup light-emitting elements 121 are disposed in the backup display region 12. The light-emitting elements 111 and the backup light-emitting elements 121 are correspondingly disposed and have the same size. The backup light-emitting elements 121 are used for replacement display when the light-emitting elements 111 are damaged to ensure the normal display effect of the display panel 10 and avoid display of a dark spot. However, since each light-emitting element 111 is provided with a backup light-emitting element 121, that is, the area ratio of the display region 11 to the backup display region 12 is similar. As a result, the size, the resolution, and the manufacturing cost of the display panel 10 are affected.

To solve the preceding technical problems, an embodiment of the present invention provides a display panel. The display panel includes a substrate and multiple display units located on a side of the substrate. The display units include multiple light-emitting elements. The light-emitting elements include main light-emitting elements and backup light-emitting elements. The number of main light-emitting elements is greater than the number of backup light-emitting elements. The main light-emitting elements are arranged in a first direction. In a second direction, a backup light-emitting element is located between two main light-emitting elements. In the second direction, at least two main light-emitting elements are disposed adjacent to each other. In this manner, when the display panel is driven to display an image, the main light-emitting elements emit light. When a dead pixel appears in a main light-emitting element, a backup light-emitting element emits light to replace the main light-emitting element in which the dead pixel appears for display. On the premise that the normal display effect of the display panel is ensured, the number of backup light-emitting elements disposed is reduced, and the manufacturing cost of the display panel is reduced.

The above is the core concept of the present invention, and the technical solutions in the embodiments of the present invention are described clearly and completely hereinafter in conjunction with the drawings in the embodiments of the present invention. Based on the embodiments of the present invention, all other embodiments obtained by those of ordinary skill in the art without creative work are within the scope of the present invention.

Figure 2:
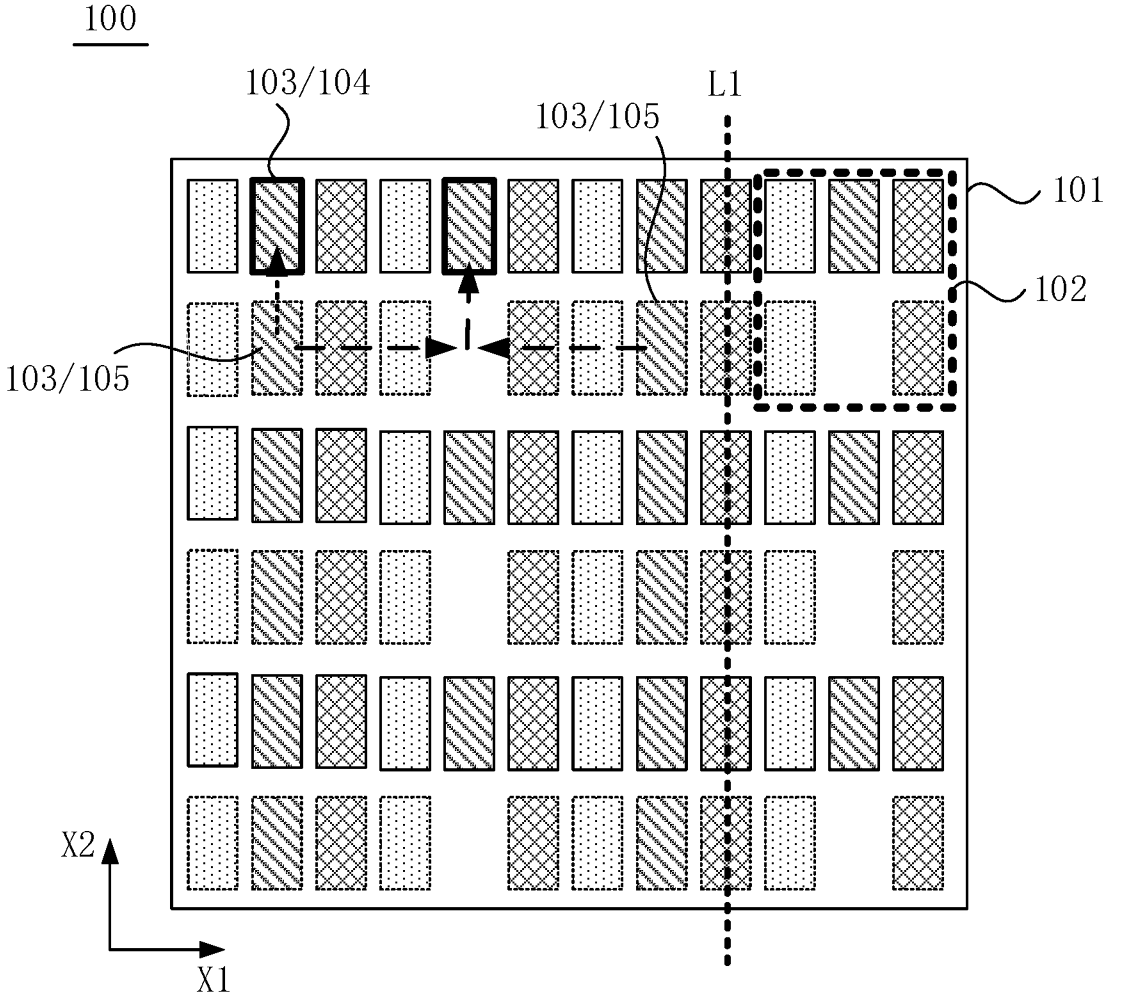
FIG. 2 is a diagram illustrating the structure of a display panel according to an embodiment of the present invention.
Figure 3:
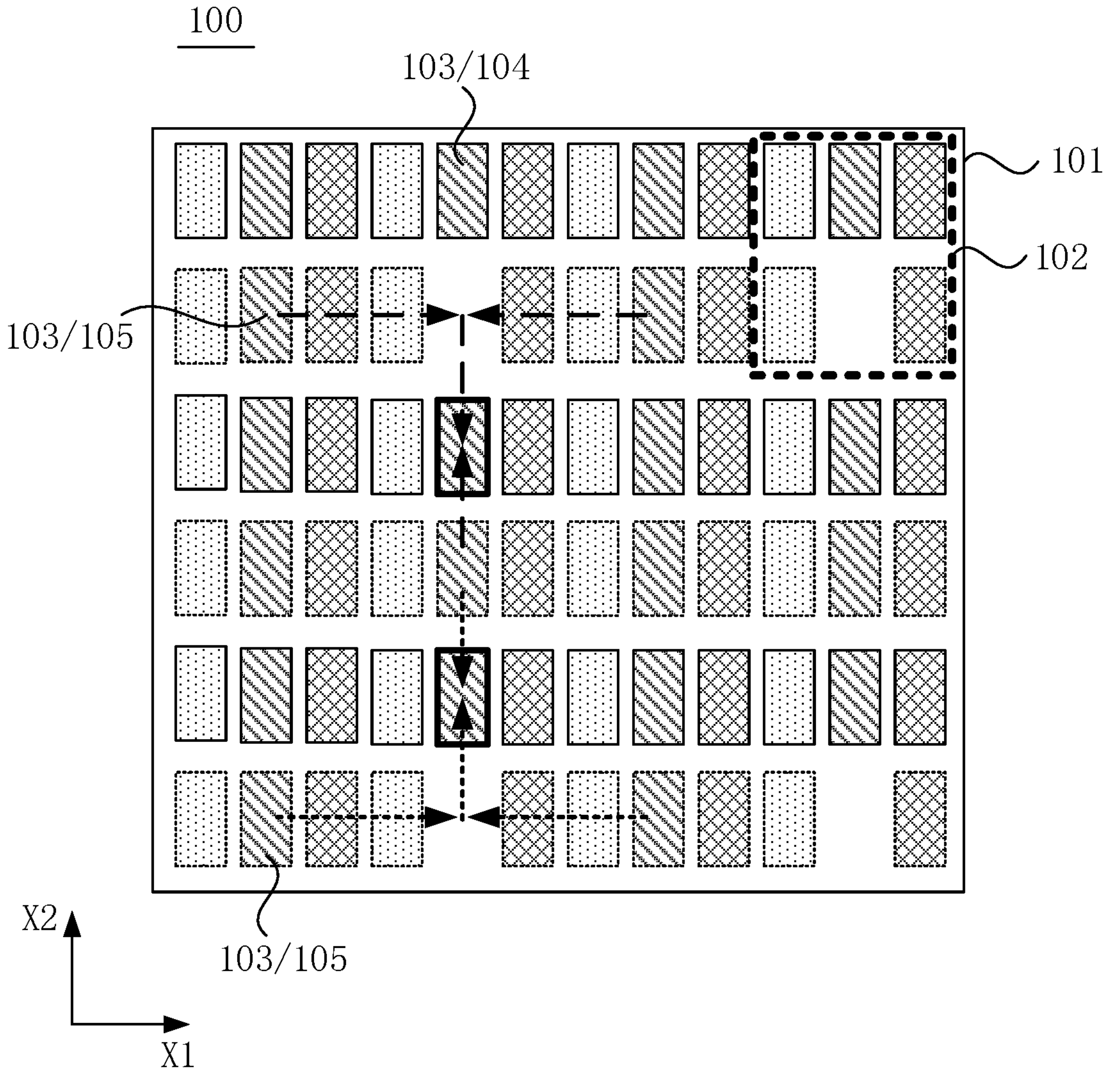
FIG. 3 is a diagram illustrating the structure of another display panel according to an embodiment of the present invention.

FIG. 2 is a diagram illustrating the structure of a display panel according to an embodiment of the present invention. FIG. 3 is a diagram illustrating the structure of a display panel according to an embodiment of the present invention. As shown in FIGS. 2 and 3, the display panel 100 includes a substrate 101 and multiple display units 102 located on a side of the substrate 101. The display units 102 include multiple light-emitting elements 103. The light-emitting elements 103 include main light-emitting elements 104 and backup light-emitting elements 105. The number of main light-emitting elements 104 is greater than the number of backup light-emitting elements 105. The main light-emitting elements 104 are arranged in a first direction X1. In a second direction X2, a backup light-emitting element 105 is located between two main light-emitting elements 104. In the second direction X2, at least two main light-emitting elements 104 are disposed adjacent to each other. The substrate 101 may include a rigid substrate or a flexible substrate. Specific materials may be selected according to actual design requirements. This is not limited in the embodiments of the present invention. The display panel 100 includes multiple display units 102 located on a side of the substrate 101. The display units 102 include multiple light-emitting elements 103. The multiple light-emitting elements 103 may include different emitted colors, thereby implementing the color display of the display panel 100. In an embodiment, the light-emitting elements 103 include organic light-emitting diodes (OLEDs), mini light-emitting diodes (mini LEDs), or micro light-emitting diodes (micro LEDs). An OLED generally includes a cathode, an anode, and an organic light-emitting layer located between the cathode and the anode. Driven by an electric field, the OLED emits light through carrier injection and recombination. The OLED has the advantages of high brightness, low power consumption, fast response, high definition, good flexibility, and high light-emitting efficiency. The size of a mini LED may be around 100 μm to 500 μm, and the size of a micro LED may be below 100 μm. Since the mini LED and the micro LED have characteristics such as a small chip size, high integration, and self-light-emitting, it is ensured that the display panel 100 has great advantages in terms of brightness, resolution, contrast, energy consumption, service life, a response speed, and thermal stability. The specific type of the light-emitting elements 103 may be selected according to actual design requirements. This is not limited in the embodiments of the present invention. The light-emitting elements 103 include main light-emitting elements 104 and backup light-emitting elements 105. For example, in the figure, the first direction X1 and the second direction X2 are perpendicular to each other for display. The main light-emitting elements 104 are arranged in the first direction X1. In the second direction X2, a backup light-emitting element 105 is located between two main light-emitting elements 104. In the second direction X2, at least two main light-emitting elements 104 are disposed adjacent to each other. That is, in the second direction X2, no light-emitting element 105 is disposed between some adjacent main light-emitting elements 104, thereby reducing the number of backup light-emitting elements 105 disposed in the display panel 100. When the display panel 100 is driven to display an image, the main light-emitting elements 104 emit light, and the backup light-emitting elements 105 do not emit light. When a dead pixel appears in a main light-emitting element 104, at least one backup light-emitting element 105 is controlled to emit light. The emitted color of the backup light-emitting element 105 is correspondingly the same as the emitted color of the main light-emitting element 104, thereby replacing the main light-emitting element 104 in which the dead pixel appears for display and ensuring the normal display of the display panel 100. When a dead pixel appears in a main light-emitting element 104, in the figure, for example, the main light-emitting element 104 in which the dead pixel appears is illustrated with a bold border. For example, as shown in FIG. 2, a backup light-emitting element 105 adjacent to the main light-emitting element 104 may emit light to perform replacement display on the main light-emitting element 104 in which the dead pixel appears. Alternatively, two backup light-emitting elements 105 adjacent to the main light-emitting element 104 may emit light to simultaneously perform replacement display on the main light-emitting element 104 in which the dead pixel appears. Alternatively, as shown in FIG. 3, three light-emitting elements 103 adjacent to the main light-emitting element 104 may emit light to simultaneously perform replacement display on the main light-emitting element 104 in which the dead pixel appears. Specifically, the number of backup light-emitting elements 105 to be lit may be selected according to actual design requirements. This is not limited in the embodiments of the present invention. In the display panel 100, the number of main light-emitting elements 104 is set to be greater than the number of backup light-emitting elements 105. Generally, the type of the main light-emitting elements 104 and the type of the backup light-emitting elements 105 are the same. The size of the main light-emitting elements 104 and the size of the backup light-emitting elements 105 may be the same or different. Selection may be performed according to actual design requirements. In FIGS. 2 and 3, display is performed by using an example in which the type and size of the main light-emitting elements 104 and the type and size of the backup light-emitting elements 105 are the same. For example, when the main light-emitting elements 104 and the backup light-emitting elements 105 are micro LEDs, the main light-emitting elements 104 and the backup light-emitting elements 105 need to be transferred from a growth substrate to a side of an array substrate in a mass transfer manner. The number of backup light-emitting elements 105 disposed is less than the number of main light-emitting elements 104, so that the number of light-emitting elements 103 to be transferred is reduced to a certain extent, and the manufacturing cost is reduced. At the same time, compared with the related art, on the premise that the normal display effect of the display panel 100 is ensured, the number of backup light-emitting elements 105 disposed is reduced, and the overall layout area of the backup light-emitting elements 105 is reduced, so that the arrangement space of the main light-emitting elements 104 is increased. Moreover, the display brightness of the display panel 100 is improved, thereby further improving the display effect of the display panel 100.

In the embodiments of the present invention, the main light-emitting elements and the backup light-emitting elements are disposed in the display panel. The backup light-emitting elements are enabled when a dead pixel appears in a main light-emitting element to perform display replacement. Thus, the normal display effect of the display panel is ensured. At the same time, the number of main light-emitting elements disposed is controlled to be less than the number of backup light-emitting elements disposed. Thus, the layout area of the backup light-emitting elements is reduced. At the same time, the preparation cost of the display panel is reduced.

Figure 4:
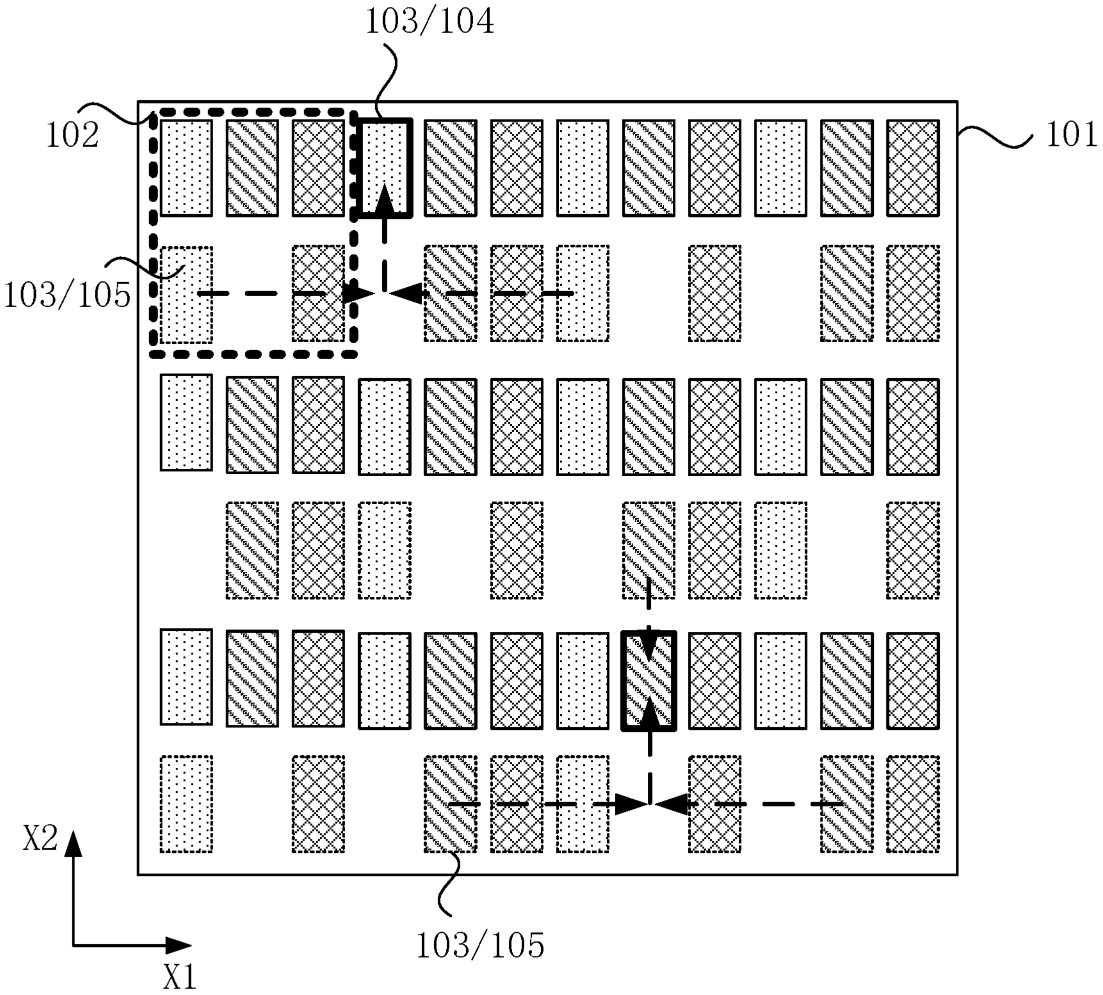
FIG. 4 is a diagram illustrating the structure of another display panel according to an embodiment of the present invention.

In an embodiment, FIG. 4 is a diagram illustrating the structure of another display panel according to an embodiment of the present invention. As shown in FIGS. 2 and 4, when a dead pixel appears in a main light-emitting element 104, a backup light-emitting element 105 adjacent to the main light-emitting element 104 in which the dead pixel appears emits light, or at least two backup light-emitting elements 105 within a preset radius centered on the main light-emitting element 104 in which the dead pixel appears emit light.

For example, as shown in FIG. 2, no backup light-emitting element 105 having the same emitted color as the main light-emitting element 104 is disposed at the position adjacent to the main light-emitting element 104. At this time, two backup light-emitting elements 105 within a preset radius centered on the main light-emitting element 104 in which the dead pixel appears may be controlled to emit light. The two backup light-emitting elements 105 emit light at the same time to perform display replacement on the main light-emitting element 104 in which the dead pixel appears, thereby avoiding the phenomenon of local dark spots and ensuring the normal display effect of the display panel 100. Alternatively, further, as shown in FIG. 4, no backup light-emitting element 105 having the same emitted color as the main light-emitting element 104 is disposed at the position adjacent to the main light-emitting element 104. At this time, three backup light-emitting elements 105 within a preset radius centered on the main light-emitting element 104 in which the dead pixel appears may be controlled to emit light. The three backup light-emitting elements 105 emit light at the same time to perform display replacement on the main light-emitting element 104 in which the dead pixel appears. Thus, the normal display effect of the display panel 100 is ensured. At the same time, when a backup light-emitting element 105 emits light, the voltage for driving the backup light-emitting element 105 is controlled according to the number of backup light-emitting elements 105 that emit light to influence the brightness of the backup light-emitting element 105. In this manner, it is ensured that the brightness of the backup light-emitting element 105 has a display replacement effect on the main light-emitting element 104 in which the dead pixel appears, and the overall display effect of the display panel 100 is ensured.

Figure 5:
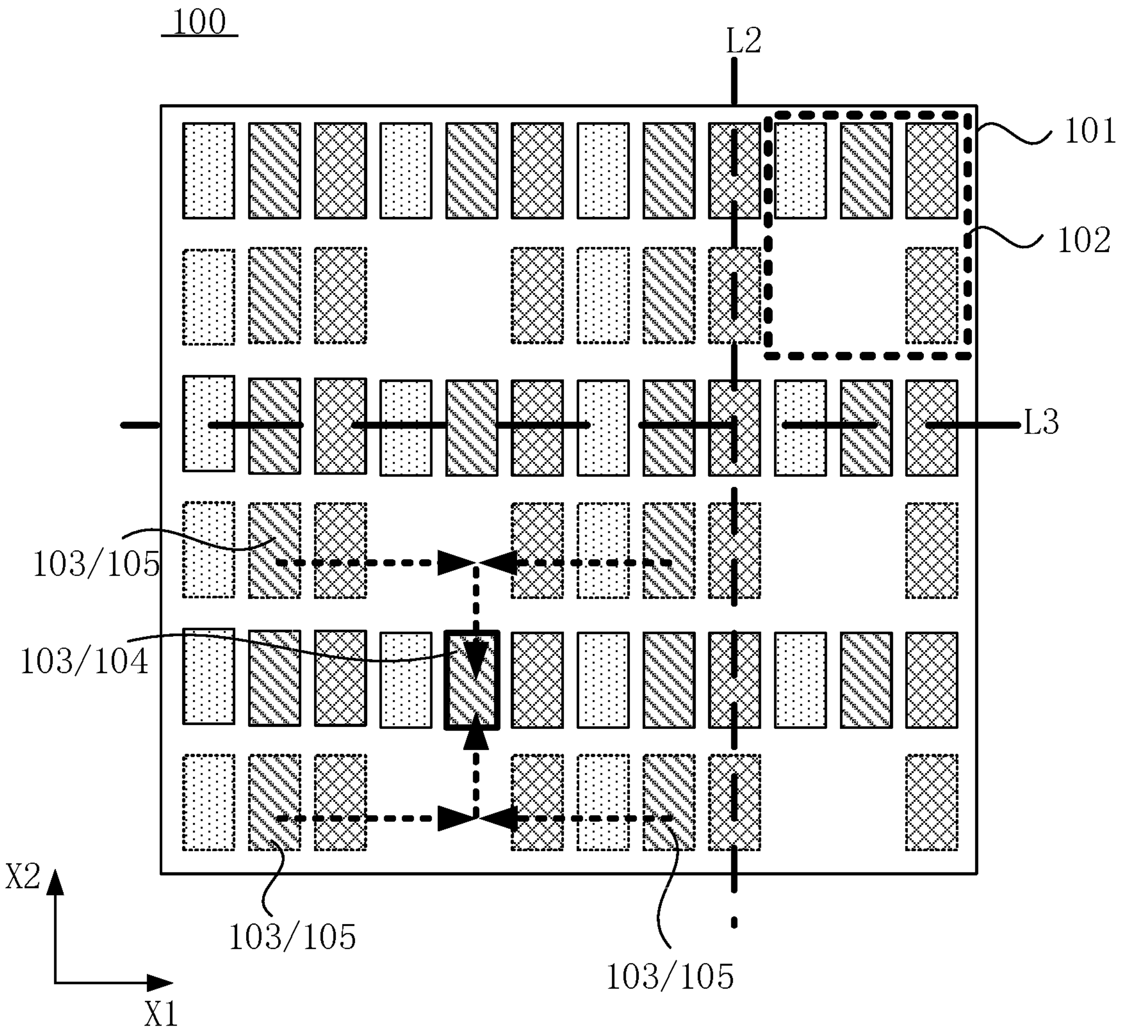
FIG. 5 is a diagram illustrating the structure of another display panel according to an embodiment of the present invention.

In an embodiment, FIG. 5 is a diagram illustrating the structure of another display panel according to an embodiment of the present invention. As shown in FIGS. 2 and 5, at least two backup light-emitting elements 105 within the preset radius centered on the main light-emitting element 104 in which the dead pixel appears are disposed symmetrically with respect to the axis of the main light-emitting element 104 in which the dead pixel appears.

For example, as shown in FIG. 2, since no backup light-emitting element 105 having the same emitted color as each main light-emitting element 104 is disposed at the position adjacent to each main light-emitting element 104 at this time, to ensure the display replacement effect on the main light-emitting element 104 in which the dead pixel appears, two backup light-emitting elements 105 within a preset radius centered on the main light-emitting element 104 in which the dead pixel appears may be controlled to light up. At this time, the two backup light-emitting elements 105 are controlled to be symmetrically disposed with respect to the axis L1 of the main light-emitting element 104 in which the dead pixel appears, so that in the same direction, the distances from the axis of the main light-emitting element 104 to the backup light-emitting elements 105 are the same. In this manner, the two backup light-emitting elements 105 simultaneously perform display replacement on the main light-emitting element 104 in which the dead pixel appears, that is, a backup light-emitting element 105 is disposed at the position adjacent to the main light-emitting element 104, and the backup light-emitting element 105 performs display replacement on the main light-emitting element 104 in which the dead pixel appears, thereby improving the effect of display replacement and ensuring the uniformity of brightness. Similarly, as shown in FIG. 5, four backup light-emitting elements 105 within a preset radius centered on the main light-emitting element 104 in which the dead pixel appears may be controlled to light up. At this time, the four backup light-emitting elements 105 are controlled to be symmetrically disposed with respect to the axis L2 and the axis L3 of the main light-emitting element 104 in which the dead pixel appears, so that in the same direction, the distances from the axis of the main light-emitting element 104 to the backup light-emitting elements 105 are the same. In this manner, the four backup light-emitting elements 105 simultaneously perform display replacement on the main light-emitting element 104 in which the dead pixel appears, that is, the specific display parameters of the four backup light-emitting elements 105, such as a drive voltage and a drive current, are adjusted and controlled to perform display replacement on the main light-emitting element 104 in which the dead pixel appears, thereby improving the effect of display replacement. At the same time, multiple backup light-emitting elements 105 are symmetrically disposed so that the brightness centers of the multiple backup light-emitting elements 105 and the center of the main light-emitting element 104 are located on the same axis. The multiple backup light-emitting elements 105 within a preset radius of the main light-emitting element 104 in which the dead pixel appears start working, so that the brightness center near the main light-emitting element 104 in which the dead pixel appears does not shift, thereby ensuring the display uniformity of the display panel 100.

In an embodiment, with continued reference to FIGS. 2, 3, 4, and 5, a display unit 102 includes three main light-emitting elements 104 having different emitted colors. At least part of the display units 102 include at most two backup light-emitting elements 105 having different emitted colors. The emitted color of a backup light-emitting element 105 is the same as the emitted color of a main light-emitting element 104. Two adjacent display units 102 include backup light-emitting elements 105 having three different emitted colors.

The display unit 102 is provided with main light-emitting elements 104 having three different emitted colors to implement the color display of the display panel 100. Since in the display panel 100, the number of main light-emitting elements 104 disposed is greater than the number of backup light-emitting elements 105 disposed, part of display units 102 cannot ensure that each main light-emitting element 104 is correspondingly provided with a backup light-emitting element 105. As shown in FIG. 5, part of the display units 102 are provided with one backup light-emitting element 105. Alternatively, as shown in FIGS. 2, 3, and 4, part of the display units 102 are provided with two backup light-emitting elements 105. At this time, two adjacent display units 102 can ensure that there are three backup light-emitting elements 105 having different emitted colors, and thus it is possible to ensure that a backup light-emitting element 105 in an adjacent display unit 102 is used to perform display replacement on a main light-emitting element 104 in which a dead pixel appears in the display unit 102. That is, the backup light-emitting elements 105 having three different emitted colors are disposed in the adjacent display units 102. When a dead pixel appears in a main light-emitting element having any color in a display unit 102, and when there is a backup light-emitting element 105 having the corresponding color in the display unit 102 where the main light-emitting element 104 in which the dead pixel appears is located, the backup light-emitting element 105 may perform display replacement. When there is no backup light-emitting element 105 having the corresponding color in the display unit 102 where the main light-emitting element 104 in which the dead pixel appears is located, the backup light-emitting element 105 in the adjacent display unit 102 may perform display replacement. The backup light-emitting element 105 in the adjacent display unit 102 is multiplexed. In this manner, the number of backup light-emitting elements 105 disposed is reduced, the manufacturing cost is reduced. At the same time, display of a dark spot is avoided, and the distance between a backup light-emitting element 105 and a main light-emitting element 104 is relatively close, so that the good replacement effect is good, and the color display effect of the display panel 100 is ensured.

Figure 6:
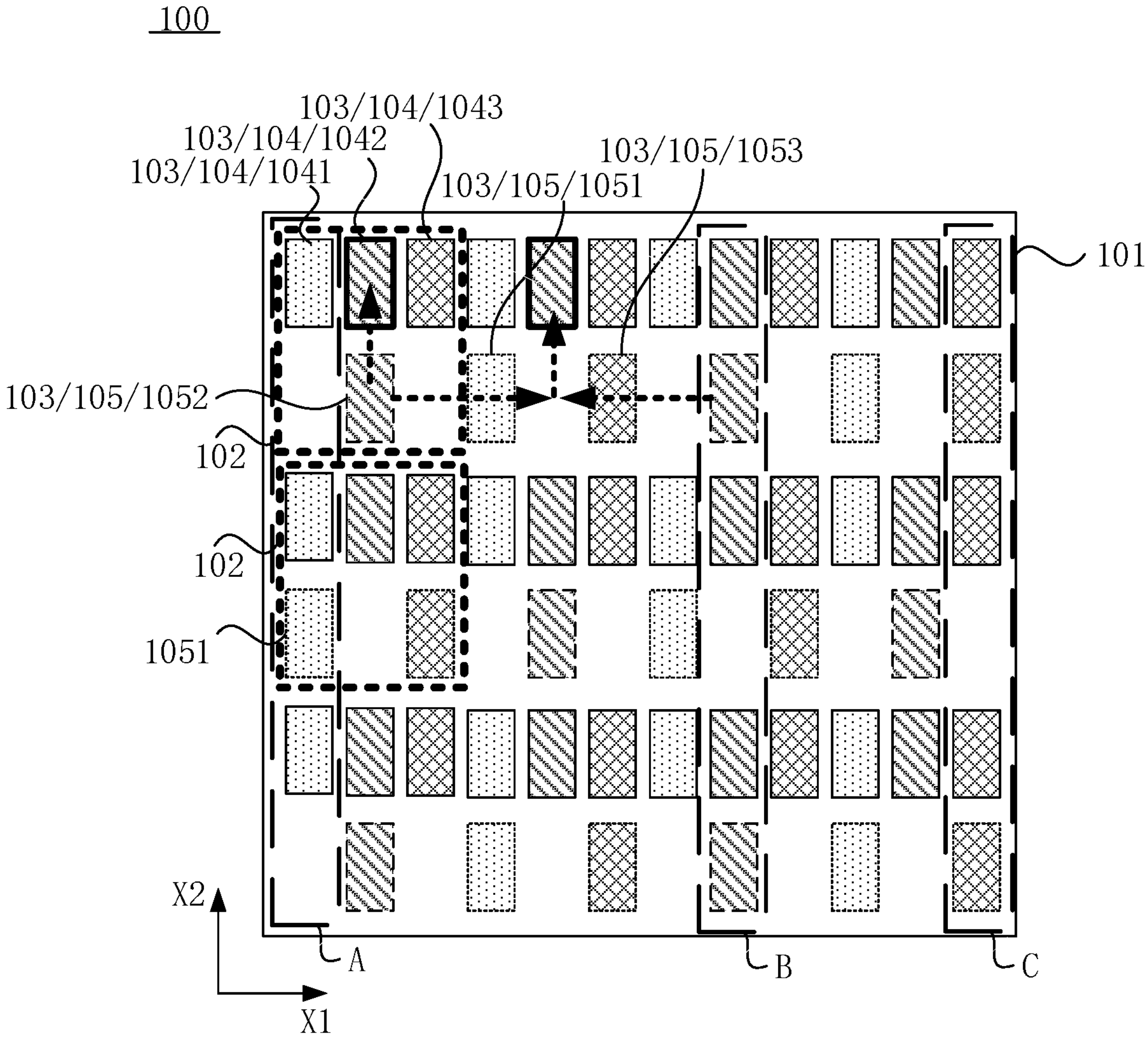
FIG. 6 is a diagram illustrating the structure of another display panel according to an embodiment of the present invention.

In an embodiment, FIG. 6 is a diagram illustrating the structure of another display panel according to an embodiment of the present invention. As shown in FIG. 6, the main light-emitting elements 104 include red main light-emitting elements 1041, green main light-emitting elements 1042, and blue main light-emitting elements 1043. The backup light-emitting elements 105 include red backup light-emitting elements 1051, green backup light-emitting elements 1052, and blue backup light-emitting elements 1053. One display unit 102 includes one red main light-emitting element 1041, one green main light-emitting element 1042, one blue main light-emitting element 1043, and one or two of one red backup light-emitting element 1051, one green backup light-emitting element 1052, and one blue backup light-emitting element 1053. In the first direction X1, the main light-emitting elements 104 having three emitted colors are cyclically arranged, and the backup light-emitting elements 105 having three emitted colors are cyclically arranged. In the second direction X2, the emitted colors of two adjacent light-emitting elements 103 are the same. The first direction X1 intersects the second direction X2. The two adjacent light-emitting elements 103 in the second direction X2 include two adjacent main light-emitting elements 104 or one backup light-emitting element 105 and one main light-emitting element 104.

The main light-emitting elements 104 include red main light-emitting elements 1041, green main light-emitting elements 1042, and blue main light-emitting elements 1043. The backup light-emitting elements 105 include red backup light-emitting elements 1051, green backup light-emitting elements 1052, and blue backup light-emitting elements 1053. For example, the first direction X1 and the second direction X2 are perpendicular to each other. In the first direction X1, the main light-emitting elements 104 having different emitted colors and the backup light-emitting elements 105 having different emitted colors are cyclically arranged. As shown in FIG. 6, one display unit 102 may include one red main light-emitting element 1041, one green main light-emitting element 1042, one blue main light-emitting element 1043, and one green backup light-emitting element 1052. One display unit 102 may include one red main light-emitting element 1041, one green main light-emitting element 1042, one blue main light-emitting element 1043, one red backup light-emitting element 1051, and one blue backup light-emitting element 1053. At this time, in the second direction X2, column A formed by red light-emitting elements 1031 is used as an example. Adjacent light-emitting elements 103 may be red main light-emitting elements 1041 respectively. Alternatively, adjacent light-emitting elements 103 may be red main light-emitting elements 1041 and red backup light-emitting elements 1051 respectively. Similarly, column B formed by green light-emitting elements 1032 and column C formed by blue light-emitting elements 1033 are arranged in the same manner as or a similar manner to column A formed by red light-emitting elements 1031, and the details are not repeated here. The number of backup light-emitting elements 105 disposed is minimized. When a dead pixel appears in part of the main light-emitting elements 104 that are not provided with a corresponding backup light-emitting element 105 at an adjacent position, the backup light-emitting element 105 having the same color in an adjacent display unit 102 may perform display. In the first direction X1, multiple backup light-emitting elements 105 having the same color may simultaneously start working to perform display replacement on an adjacent main light-emitting element 104. As shown in FIG. 6, green backup light-emitting elements 1032 in two adjacent display units 102 may perform display replacement on the green main light-emitting element 1042 in the display unit 102 located between the two adjacent display units 102. In the second direction X2, when a dead pixel appears in part of the main light-emitting elements 104 that are provided with a corresponding backup light-emitting element 105 at an adjacent position, the corresponding backup light-emitting element 105 may directly perform display replacement. As shown in FIG. 6, a green backup light-emitting element 1032 in a display unit 102 may directly perform display replacement on the green main light-emitting element 1042 in the display unit 102 where the green backup light-emitting element 1032 is located. In this manner, a backup light-emitting element 105 performs display replacement on a main light-emitting element 104 corresponding to the backup light-emitting element 105, and at the same time, the backup light-emitting element 104 may also be multiplexed to perform display replacement on the main light-emitting element 104 in the adjacent display unit 102. On the premise that the display effect of the display panel 100 is ensured, light-emitting elements 103 having different colors are arranged and placed reasonably, and the number of backup light-emitting elements 105 disposed is minimized, so that when a dead pixel appears in any main light-emitting element 104, the backup light-emitting element 105 having the corresponding color performs display replacement on the main light-emitting element 104. Thus, the normal color display effect is ensured. At the same time, correspondingly, in the first direction X1, backup light-emitting elements 105 having different colors in the same row are cyclically arranged at the same interval, thereby effectively reducing the transfer difficulty of the backup light-emitting elements 105 and reducing the preparation cost.

Figure 7:
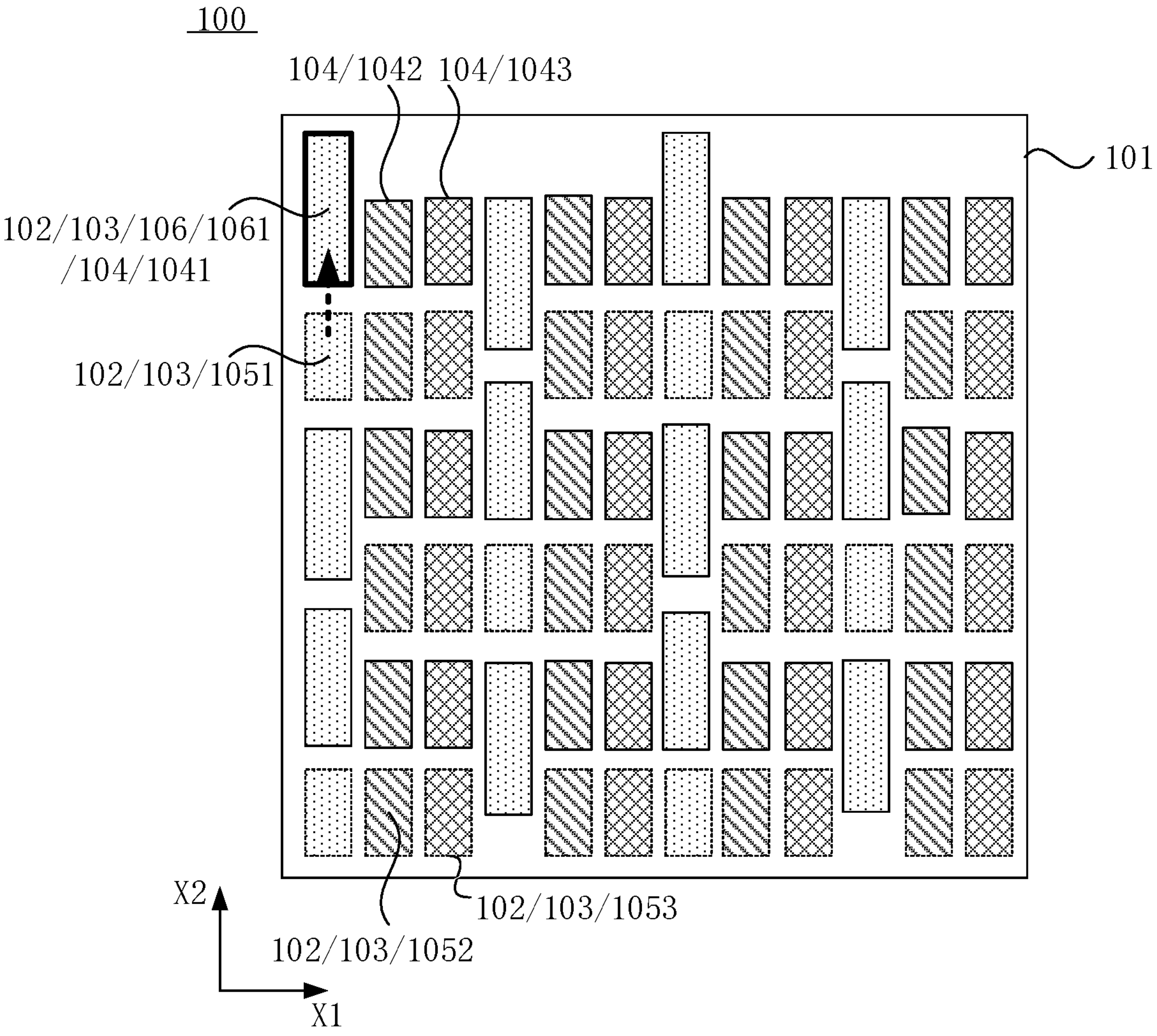
FIG. 7 is a diagram illustrating the structure of another display panel according to an embodiment of the present invention.

In an embodiment, FIG. 7 is a diagram illustrating the structure of another display panel according to an embodiment of the present invention. As shown in FIG. 7, the main light-emitting elements 104 include first main light-emitting elements 106. The light-emitting area of the first main light-emitting elements 106 is greater than the light-emitting area of the backup light-emitting elements 105. The light-emitting elements 103 are arranged in the first direction X1 and the second direction X2. The first direction X1 intersects the second direction X2. In the first direction X1 or the second direction X2, the projection of a backup light-emitting element 105 at least partially overlaps the projection of at least one adjacent first main light-emitting element 106.

For example, the first direction X1 and the second direction X2 are perpendicular to each other. On the basis of the display panel 100 in the related art, the number of backup light-emitting elements 105 disposed is reduced, so that the number of main light-emitting elements 104 disposed is greater than the number of backup light-emitting elements 105 disposed. Thus, the space in which a backup light-emitting element 104 is not disposed may be used for increasing the light-emitting area of the main light-emitting elements 104. The main light-emitting elements 104 include first main light-emitting elements 106. At this time, the light-emitting area of the first main light-emitting elements 106 may be adjusted, so that the size of a first main light-emitting element 106 extends to the space of a correspondingly removed backup light-emitting element 105. In this manner, the light-emitting area of the first main light-emitting elements 106 is greater than the light-emitting area of the backup light-emitting elements 105. At the same time, the light-emitting elements 103 having different emitted colors are arranged in the first direction X1, and the light-emitting elements 103 having the same color are arranged in the second direction X2. In the first direction X1 or in the second direction X2, the projection of a backup light-emitting element 105 at least partially overlaps the projection of at least one adjacent first main light-emitting element 106. The space where no light-emitting element 105 is disposed is used for increasing the light-emitting area and arrangement space of the first main light-emitting elements 106. For example, display is performed with reference to FIG. 7 by using an example in which the light-emitting area of the red main light-emitting elements 1041 is increased to utilize the space where a red backup light-emitting element 1051 is not disposed. When a dead pixel appears in a red first main light-emitting element 1061, in the second direction X2, the corresponding red backup light-emitting element 1051 performs display replacement on the adjacent first main light-emitting element 106 located in the same column. In this manner, display of a dark spot in the display panel 100 is avoided, and the display effect of the display panel 100 is ensured. At the same time, since the light-emitting efficiency of a red main light-emitting element 1041 is lower than the light-emitting efficiency of a green main light-emitting element 1042 and the light-emitting efficiency of a blue main light-emitting element 1043, the space in which a red backup light-emitting element 1041 is not disposed is used for increasing the light-emitting area of the red main light-emitting elements 1041 adaptively and compensating for the brightness of the red main light-emitting elements 1041 in the display panel 100, thereby ensuring the overall color display effect of the display panel 100.

Figure 8:
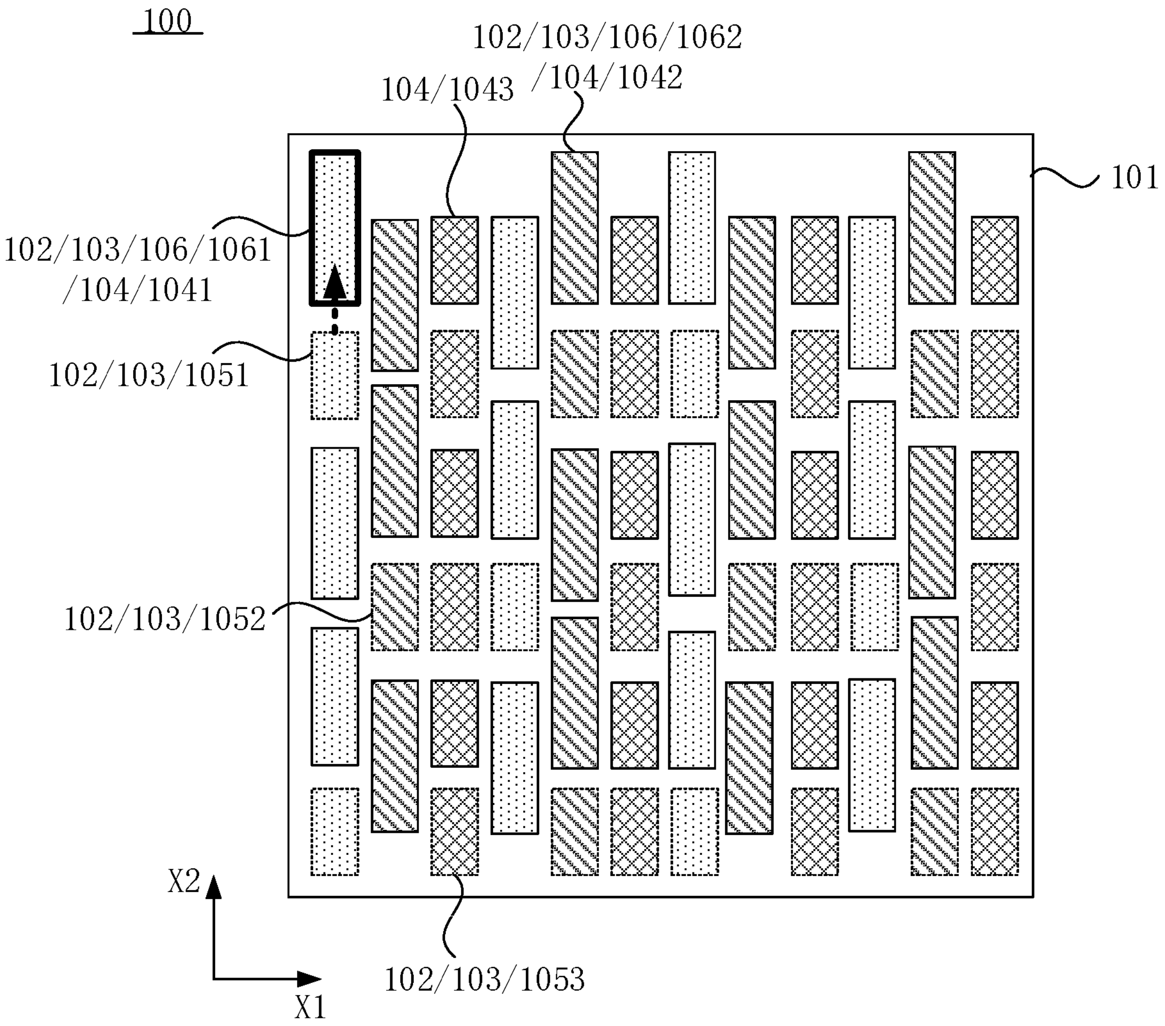
FIG. 8 is a diagram illustrating the structure of another display panel according to an embodiment of the present invention.
Figure 9:
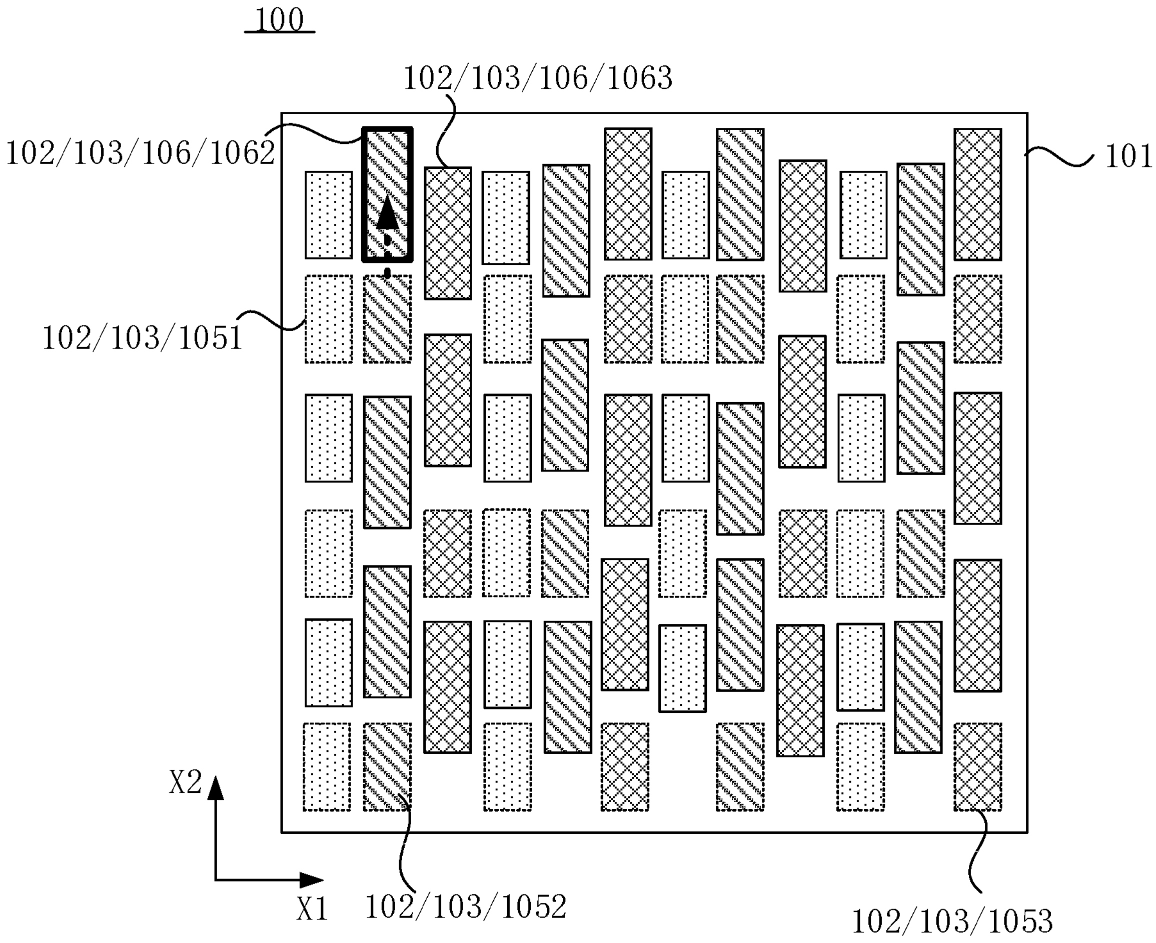
FIG. 9 is a diagram illustrating the structure of another display panel according to an embodiment of the present invention.
Figure 10:
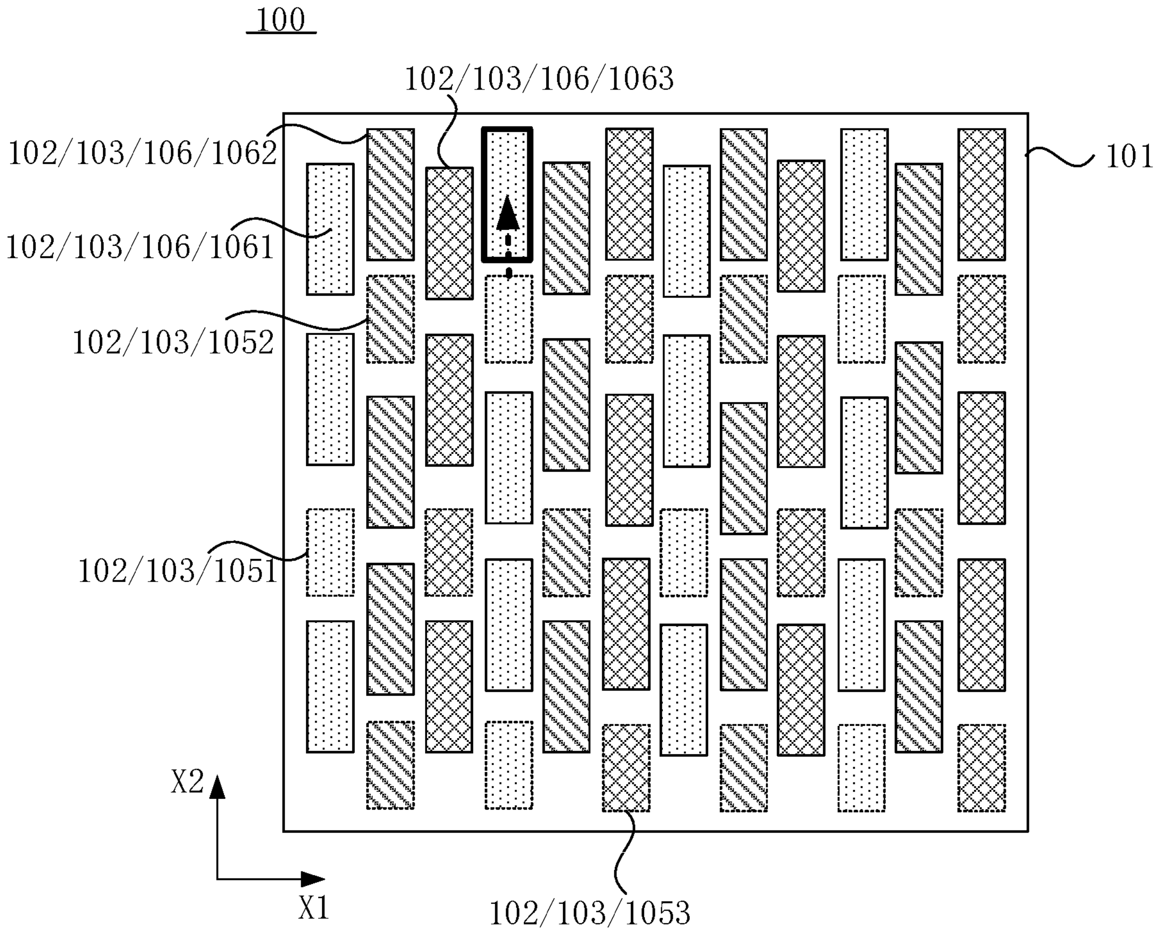
FIG. 10 is a diagram illustrating the structure of another display panel according to an embodiment of the present invention.

In an embodiment, FIG. 8 is a diagram illustrating the structure of another display panel according to an embodiment of the present invention. FIG. 9 is a diagram illustrating the structure of another display panel according to an embodiment of the present invention. FIG. 10 is a diagram illustrating the structure of another display panel according to an embodiment of the present invention. As shown in FIGS. 7, 8, 9, and 10, the light-emitting elements 103 include first main light-emitting elements 106 having three different emitted colors and backup light-emitting elements 105 having three different emitted colors. Light-emitting areas of the backup light-emitting elements 105 having different emitted colors are the same. The light-emitting areas of first main light-emitting elements having at least one emitted color are greater than the light-emitting areas of the backup light-emitting elements.

The first main light-emitting elements 106 include red first main light-emitting elements 1061, green first main light-emitting elements 1062, and blue first main light-emitting elements 1063, which emit light in different colors. The light-emitting elements 103 of first main light-emitting elements 106 having different emitted colors may be correspondingly adjusted according to the arrangement of the backup light-emitting elements 105. In the display panel 100, the light-emitting area of the red backup light-emitting elements 1051, the light-emitting area of the green backup light-emitting elements 1052, and the light-emitting area of the blue backup light-emitting elements 1053 are kept the same. The first main light-emitting elements 106 may utilize the space where a backup light-emitting element 105 is not disposed. For example, as shown in FIG. 7, the light-emitting area of the red first main light-emitting elements 1061 is adjusted to be greater than the light-emitting area of the red backup light-emitting elements 1051, and the light-emitting area of the green first main light-emitting elements 1062 and the light-emitting area of the blue first main light-emitting elements 1063 are not adjusted. As shown in FIG. 8, the light-emitting area of the red first main light-emitting elements 1061 is adjusted to be greater than the light-emitting area of the red backup light-emitting elements 1051, the light-emitting area of the green first main light-emitting elements 1062 is adjusted to be greater than the light-emitting area of the green backup light-emitting elements 1052, and the light-emitting area of the blue first main light-emitting elements 1063 is not adjusted. As shown in FIG. 9, the light-emitting area of the green first main light-emitting elements 1062 is adjusted to be greater than the light-emitting area of the green backup light-emitting elements 1052, the light-emitting area of the blue first main light-emitting elements 1063 is adjusted to be greater than the light-emitting area of the blue backup light-emitting elements 1053, and the light-emitting area of the red first main light-emitting elements 1061 is not adjusted. As shown in FIG. 10, the light-emitting area of the red first main light-emitting elements 1061 is adjusted to be greater than the light-emitting area of the red backup light-emitting elements 1051, the light-emitting area of the green first main light-emitting elements 1062 is adjusted to be greater than the light-emitting area of the green backup light-emitting elements 1052, and the light-emitting area of the blue first main light-emitting elements 1063 is adjusted to be greater than the light-emitting area of the blue backup light-emitting elements 1053. The light-emitting area of the first main light-emitting elements 106 is adjusted correspondingly according to the arrangement of the backup light-emitting elements 105. On the premise that it is ensured that the number of backup light-emitting elements 105 is less than the number of first main light-emitting elements 106, and that a backup light-emitting element 105 performs display replacement on a first main light-emitting element 106 in which a dead pixel appears, the light-emitting area of the corresponding red first main light-emitting element 1061, the light-emitting area of the corresponding green first main light-emitting element 1062, and the light-emitting area of the corresponding blue first main light-emitting element 1063 are adjusted adaptively. In this manner, the space where a backup light-emitting element 105 is not disposed is effectively used, and the display effect of the display panel 100 is ensured. At the same time, since the number of backup light-emitting elements 105 disposed having different colors is less, the number of adjustable first main light-emitting elements 106 is greater, and the available space where a backup light-emitting element 105 is not disposed is more. On the contrary, the number of backup light-emitting elements 105 disposed is greater, the available space where a backup light-emitting element 105 is not disposed is less, and the number of adjustable first main light-emitting elements 106 is less. Thus, the number of first main light-emitting elements 106 in the main light-emitting elements 104 may be adjusted correspondingly according to the number of backup light-emitting elements 105 disposed in different display panels in the actual design and the required color display effect. This is not limited in the embodiments of the present invention.

In an embodiment, with continued reference to FIG. 10, in the first direction X1 or the second direction X2, a backup light-emitting element 105 partially overlaps the projections of two adjacent first main light-emitting elements 106 having different emitted colors.

In the display panel 100, the light-emitting areas of first main light-emitting elements 106 having different emitted colors are greater than the light-emitting areas of the corresponding backup light-emitting elements 105. For example, a red backup light-emitting element 1051 is used as an example. As shown in FIG. 10, in the first direction X1, the first main light-emitting elements 106 adjacent to the red backup light-emitting elements 1051 are the green first main light-emitting element 1062 and the blue first main light-emitting element 1063 respectively. A red main light-emitting element 1051 partially overlaps the adjacent green first main light-emitting element 1062 and the blue first main light-emitting element 1063, that is, the green first main light-emitting element 1062 utilizes the space in which a green backup light-emitting element 1052 is not disposed, a blue first main light-emitting element 1063 utilizes the space in which a blue backup light-emitting element 1053 is not disposed. In this manner, the number of backup light-emitting elements 105 disposed is reduced, the light-emitting area of the first main light-emitting elements 106 is increased, and the display effect of the display panel 100 is ensured. At the same time, the space where no backup light-emitting element 105 is disposed is used for increasing the light-emitting area of the first main light-emitting elements 106 and adaptively compensating for the display brightness of the first main light-emitting elements 106 having different colors. In FIG. 10, for example, display is performed by using an example in which the light-emitting areas of the first main light-emitting elements 106 having different emitted colors are adjusted to be the same. The light-emitting areas of the first main light-emitting elements 106 having different emitted colors may be correspondingly adjusted according to actual display requirements. This is not limited in the embodiments of the present invention.

In an embodiment, with continued reference to FIG. 10, the light-emitting areas of the first light-emitting elements 106 having different emitted colors are the same.

In the display panel 100, on the basis that the light-emitting areas of first main light-emitting elements 106 having different emitted colors are greater than the light-emitting areas of the corresponding backup light-emitting elements 105, the light-emitting areas of the first main light-emitting elements 106 having different emitted colors may be adjusted to be the same. That is, the light-emitting area of red first main light-emitting elements 1061, the light-emitting area of green first main light-emitting elements 1062, and the light-emitting area of blue first main light-emitting elements 1063 are the same. The light-emitting areas are the same, so that the first main light-emitting elements 106 having different colors may be prepared synchronously. In this manner, the preparation technique is simplified, the preparation difficulty is reduced. At the same time, it is ensured that the space where no backup light-emitting element 105 is disposed is reasonably utilized, and that on the premise that a backup light-emitting element 105 performs display replacement on a first main light-emitting element 106 in which a dead pixel appears, the display effect of the display panel 100 is ensured. Further, the number of backup light-emitting elements 105 disposed is reduced, so that more arrangement space is provided for the first main light-emitting elements 106, and the light-emitting area of the first main light-emitting elements 106 is adaptively increased. In this manner, the overall display brightness of the first main light-emitting elements 106 having different colors is improved, thereby improving the display effect of the display panel 100.

Figure 11:
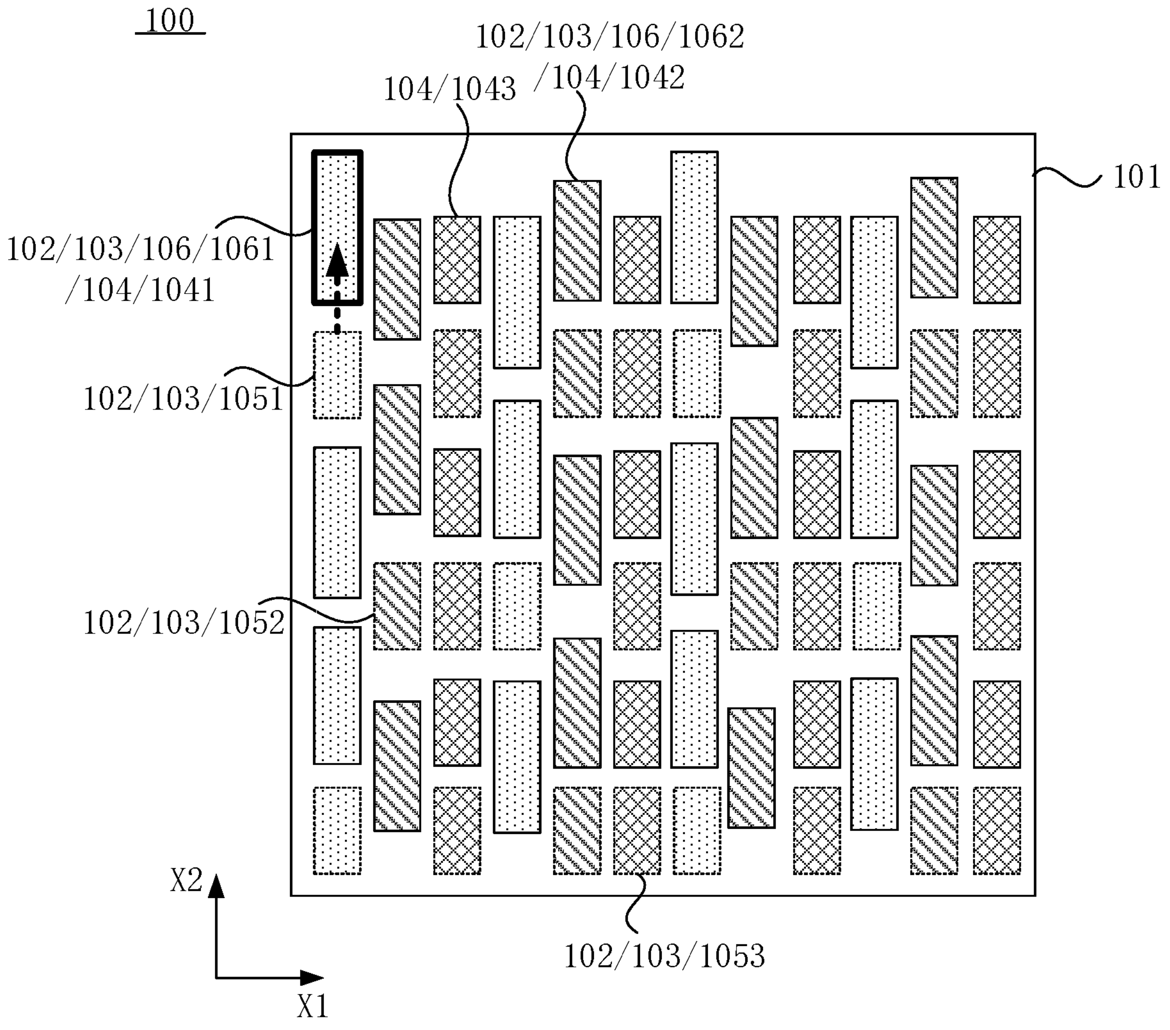
FIG. 11 is a diagram illustrating the structure of another display panel according to an embodiment of the present invention.

In an embodiment, FIG. 11 is a diagram illustrating the structure of another display panel according to an embodiment of the present invention. As shown in FIGS. 8 and 11, the main light-emitting elements 104 include red main light-emitting elements 1041, green main light-emitting elements 1042, and blue main light-emitting elements 1043. The light-emitting area S1 of a red main light-emitting element 1041, the light-emitting area S2 of a green main light-emitting element 1042, and the light-emitting area S3 of a blue main light-emitting element 1043 satisfy $S1 \geq S2 > S3$.

When the number of backup light-emitting elements 105 is reduced, the blue backup light-emitting elements 1053 may be reserved, and only the number of red backup light-emitting elements 1051 and the number of green backup light-emitting elements 1052 are reduced. In this manner, in the second direction X2, adjacent main light-emitting elements 104 may share the same backup light-emitting element 105. Thus, corresponding to the area where a red backup light-emitting element 1051 and a green backup light-emitting element 1052 are not disposed, the light-emitting area of the red main light-emitting elements 1041 and the light-emitting area of the green main light-emitting elements 1042 may be adjusted. In this manner, the light-emitting effect of the red main light-emitting elements 1041 and the light-emitting effect of the green main light-emitting elements 1042 are ensured, so that the light-emitting area of the red main light-emitting elements 1041 and the light-emitting area of the green main light-emitting elements 1042 are each greater than the light-emitting area of the backup light-emitting elements 105. As shown in FIG. 11, the light-emitting area of the red main light-emitting elements 1041 is greater than the light-emitting area of the green main light-emitting elements 1042, and the light-emitting area of the red main light-emitting elements 1041 and the light-emitting area of the green main light-emitting elements 1042 are each greater than the light-emitting area of the blue main light-emitting elements 1043. As shown in FIG. 8, the light-emitting area of the red main light-emitting elements 1041 is equal to the light-emitting area of the green main light-emitting elements 1042, and the light-emitting area of the red main light-emitting elements 1041 and the light-emitting area of the green main light-emitting elements 1042 are each greater than the light-emitting area of the blue main light-emitting elements 1043. The preceding methods ensure the reasonable utilization of the arrangement space. Specifically, the light-emitting area of the red main light-emitting elements 1041 and the light-emitting area of the green main light-emitting elements 1042 may be selected according to actual design requirements. This is not limited in the embodiments of the present invention.

Figure 12:
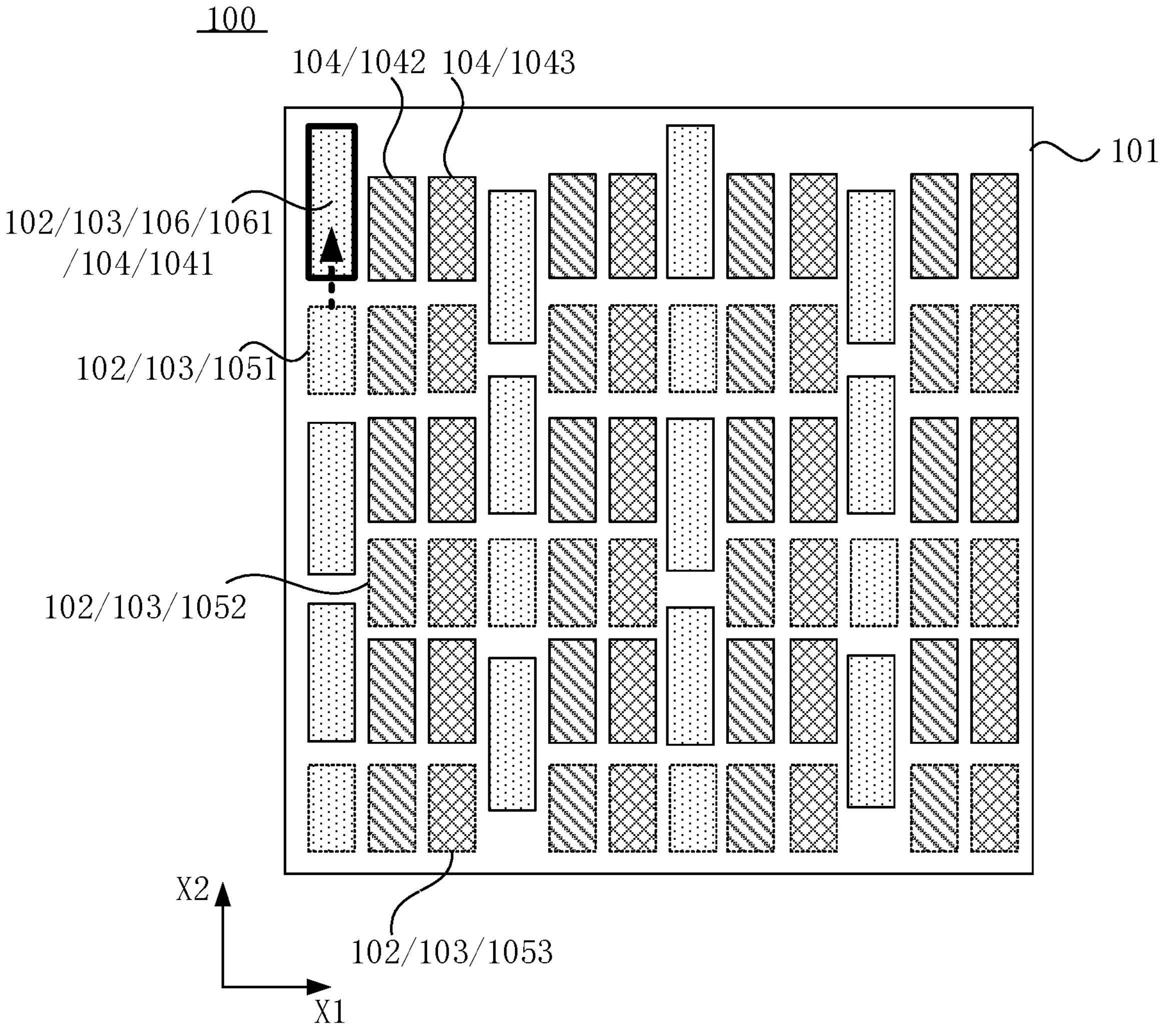
FIG. 12 is a diagram illustrating the structure of another display panel according to an embodiment of the present invention.

In an embodiment, FIG. 12 is a diagram illustrating the structure of another display panel according to an embodiment of the present invention. As shown in FIG. 12, the main light-emitting elements 104 include red main light-emitting elements 1041, green main light-emitting elements 1042, and blue main light-emitting elements 1043. The light-emitting area S1 of a red main light-emitting element 1041, the light-emitting area S2 of a green main light-emitting element 1042, and the light-emitting area S3 of a blue main light-emitting element 1043 satisfy $S1 > S2 = S3$.

When the number of backup light-emitting elements 105 disposed is reduced, the blue backup light-emitting elements 1053 and the green backup light-emitting elements 1052 may be reserved, and only the number of red backup light-emitting elements 1051 is reduced. Corresponding to the area where a red backup light-emitting element 1051 is not disposed, the light-emitting area of the red main light-emitting elements 1041 is adjusted, so that the light-emitting effect of the red main light-emitting elements 1041 is ensured. In this manner, the light-emitting area of the red main light-emitting elements 1041 is greater than the light-emitting area of the backup light-emitting elements 105. The light-emitting area of the green main light-emitting elements 1042 is equal to the light-emitting area of the blue main light-emitting elements 1043. The light-emitting area of the red main light-emitting elements 1041 is greater than the light-emitting area of the green main light-emitting elements 1042 and the light-emitting area of the blue main light-emitting elements 1043. Thus the reasonable utilization of the arrangement space is ensured. At the same time, the display effect of the display panel 100 is improved. As shown in FIG. 12, since the light-emitting efficiency of a red main light-emitting element 1041 is less than the light-emitting efficiency of a green main light-emitting element 1042 and the light-emitting efficiency of a blue main light-emitting element 1043. When the space where no backup light-emitting element 105 is disposed is utilized, adaptively, the light-emitting area of the red main light-emitting elements 1041 whose area is increased is greater than the light-emitting area of the green main light-emitting elements 1042 and the light-emitting area of the blue main light-emitting elements 1043. Furthermore, the brightness of the red main light-emitting elements 1041 in the display panel 100 is compensated to a great extent, thereby balancing the overall color display effect of the display panel 100. As shown in FIG. 11, further, since the light-emitting efficiency of a green main light-emitting element 1042 is also less than the light-emitting efficiency of a blue main light-emitting element 1043, on the basis that the light-emitting area of the red main light-emitting elements 1041 is increased, at the same time, the space where no green backup light-emitting element 1052 is disposed is used for increasing the light-emitting area of the green main light-emitting elements 1042 adaptively and compensating for the brightness of a red main light-emitting element 1041 and the brightness of a green main light-emitting element 1042, thereby further improving the overall display effect of the display panel. Specifically, the light-emitting area of the red main light-emitting elements 1041, the light-emitting area of the green main light-emitting elements 1042, and the light-emitting area of the blue main light-emitting elements 1043 may be selected according to actual design requirements. This is not limited in the embodiments of the present invention.

In an embodiment, with continued reference to FIG. 7, the light-emitting area of a green main light-emitting element 1042 is the same as the area of a backup light-emitting element 105.

The green backup light-emitting elements 1052 are reserved, so that the light-emitting area of a green main light-emitting element 1042 may be controlled to be the same as the light-emitting area of a backup light-emitting element 105, and it is ensured that brightness compensation may be performed by the backup light-emitting element 105 adjacent to the green main light-emitting element 1042 when a dead pixel appears in the green main light-emitting element 1042. At the same time, since the light-emitting area of the green main light-emitting element 1042 is the same as the light-emitting area of the backup light-emitting element 105, the same drive voltage may be applied to the green main light-emitting element 1042 and the backup light-emitting element 105, so that when a dead pixel appears in the green main light-emitting element 1042, the same display brightness as the display brightness of the green main light-emitting element 1042 can be reached when the green backup light-emitting element 1052 corresponding to the green main light-emitting element 1042 starts working, thereby ensuring the overall brightness and display effect of the display panel 100. At the same time, since the light-emitting area of the green main light-emitting element 1042 is the same as the light-emitting area of the backup light-emitting element 105, the green main light-emitting element 1042 and the green backup light-emitting element 105 may be simultaneously prepared. In this manner, the preparation difficulty of the light-emitting elements 103 is reduced, and the manufacturing cost is reduced.

Figure 13:
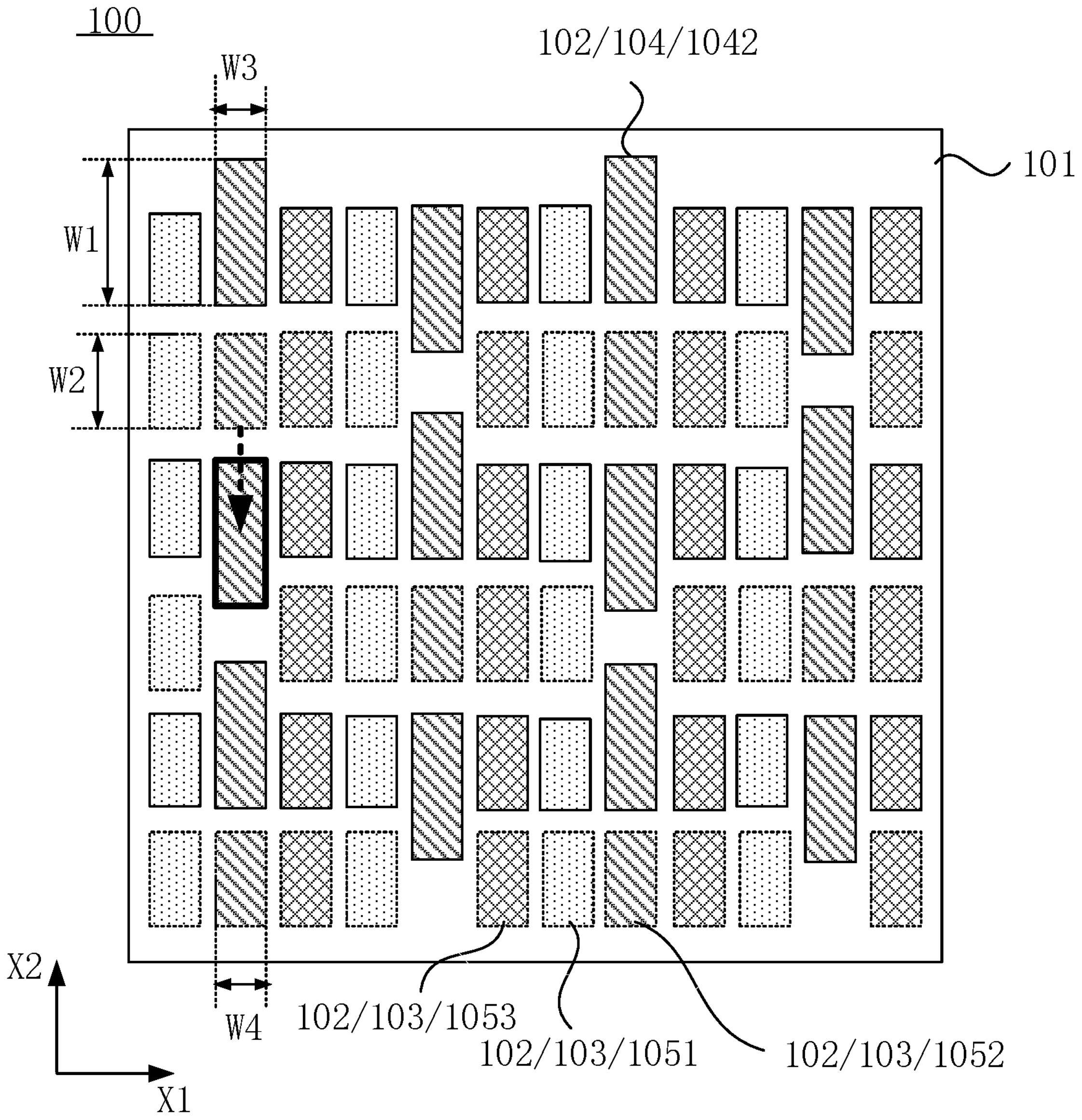
FIG. 13 is a diagram illustrating the structure of another display panel according to an embodiment of the present invention.

In an embodiment, FIG. 13 is a diagram illustrating the structure of another display panel according to an embodiment of the present invention. As shown in FIG. 13, in the second direction X2, the size W1 of a main light-emitting element 104 is greater than the size W2 of a backup light-emitting element 105. In the first direction X1, the size W3 of the main light-emitting element 104 is equal to the size W4 of the backup light-emitting element 105. The second direction X2 intersects the first direction X1.

Since the number of backup light-emitting elements 105 disposed is less than the number of main light-emitting elements 104 disposed, the space where no backup light-emitting element 105 is disposed may be utilized. For example, the second direction X2 and the first direction X1 are perpendicular to each other. The second direction X2 is the column direction in which the light-emitting elements 103 are arranged, and the first direction X1 is the row direction in which the light-emitting elements 103 are arranged. Since in the second direction X2, part of the backup light-emitting elements 105 are not disposed between adjacent rows, the corresponding space where no backup light-emitting element 105 is disposed may be utilized. At this time, in FIG. 13, for example, display is performed by using an example in which part of the green backup light-emitting elements 1052 are not disposed. The space where no green backup light-emitting element 1052 is disposed is located between adjacent green main light-emitting elements 1042 in the second direction X2. For this reason, a green main light-emitting element 1042 may be controlled to extend in the second direction X2. In this manner, in the second direction X2, the size W1 of the green main light-emitting element 1042 is greater than the size of a green backup light-emitting element 1052. Since there is no extensible space in the first direction X1, in the first direction X1, the size W3 of the green main light-emitting element 1042 is equal to the size W4 of the green backup light-emitting element 1052, so that the display brightness of the green main light-emitting element 1042 can be improved according to display requirements. Similarly, the space in which a red backup light-emitting element 1051 is not disposed and the space in which a blue backup light-emitting element 1053 is not disposed may be adjusted correspondingly, and the details are not repeated here. That is, a main light-emitting element 104 extends in the second direction X2 to the space where a backup light-emitting element 105 is not disposed, and the size of the main light-emitting element 104 in the first direction X1 remains unchanged. In this manner, the light-emitting area of the main light-emitting element 104 is greater than the light-emitting area of the backup light-emitting element 105. On the premise that it is ensured that the backup light-emitting element 105 performs light-emitting compensation on a main light-emitting element 104 in which a dead pixel appears, the arrangement space of the main light-emitting elements 104 and the brightness of the main light-emitting element 104 having the corresponding color are increased, so that the display requirement of the display panel 100 is ensured. The color and number of reduced backup light-emitting elements 105 in the display panel 100 and the extension size of the main light-emitting element 104 in the first direction X1 may be selected according to actual design requirements. This is not limited in the embodiments of the present invention.

Figure 14:
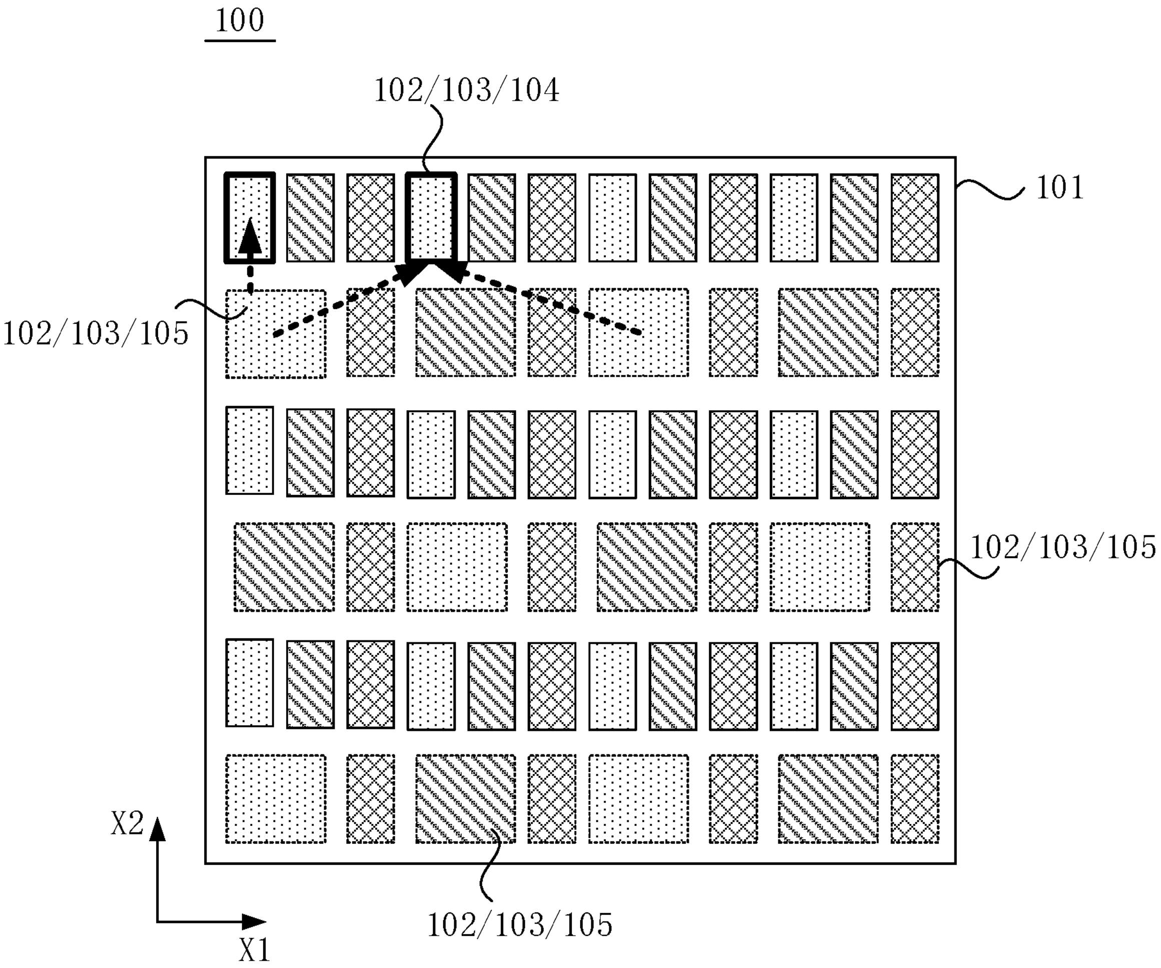
FIG. 14 is a diagram illustrating the structure of another display panel according to an embodiment of the present invention.

In an embodiment, FIG. 14 is a diagram illustrating the structure of another display panel according to an embodiment of the present invention. As shown in FIG. 14, the light-emitting areas of at least part of the backup light-emitting elements 105 are greater than light-emitting areas of the main light-emitting elements 104.

When the number of main light-emitting elements 104 disposed is greater than the number of backup light-emitting elements 105 disposed, there is at least one backup light-emitting element 105 that is not disposed in the same display unit 102. For the space where no backup light-emitting element 105 is disposed, in a display unit 102, the size of a backup light-emitting element 105 adjacent to the space in which the backup light-emitting element 105 is not disposed may be increased, so that the light-emitting area of the backup light-emitting element 105 is greater than the light-emitting area of a main light-emitting element 104. As shown in FIG. 14, it is ensured that when a dead pixel appears in a main light-emitting element 104, one adjacent backup light-emitting element 105 or at least two of the backup light-emitting elements 105 within a preset radius centered on the main light-emitting element 104 in which the dead pixel appears are lit up to perform brightness compensation. At the same time, the light-emitting area of the backup light-emitting element 105 is greater than the light-emitting area of the main light-emitting element 104. In one aspect, when multiple main light-emitting elements 104 are damaged, and the same backup light-emitting element 105 is used for display replacement, it is ensured that the brightness provided by the backup light-emitting element 105 is equal to the brightness of the main light-emitting element 104 in which the dead pixel appears. In another aspect, the increase of the size of the backup light-emitting element 105 is equivalent to the reduction of the distance between the backup light-emitting element 105 and the to-be-replaced main light-emitting element 104. In this manner, a good display replacement effect can be ensured, and the display brightness of the main light-emitting element 104 in which the dead pixel appears can be ensured, thereby avoiding a display unevenness or dark spot phenomenon, and ensuring the overall display effect of the display panel 100.

Figure 15:
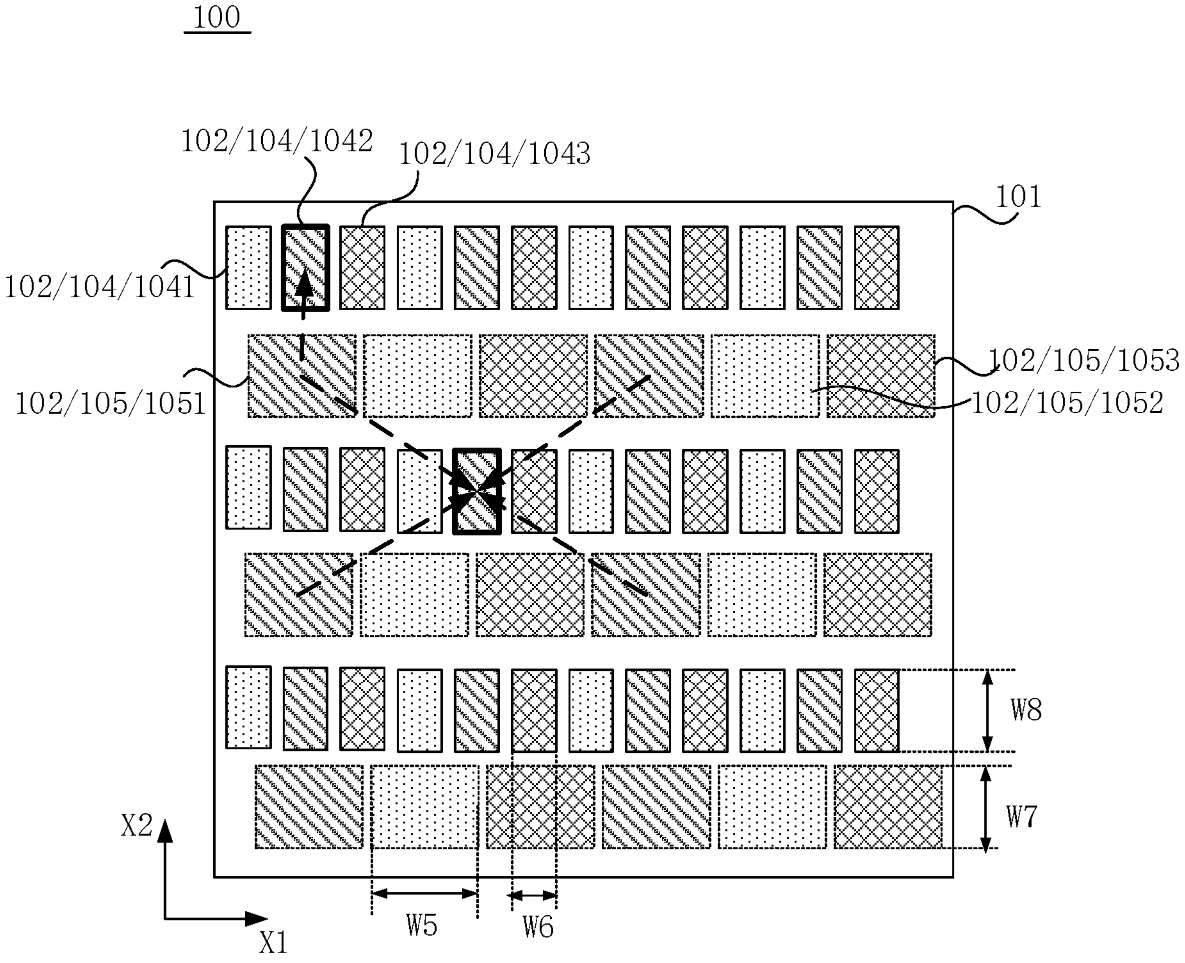
FIG. 15 is a diagram illustrating the structure of another display panel according to an embodiment of the present invention.

In an embodiment, FIG. 15 is a diagram illustrating the structure of another display panel according to an embodiment of the present invention. As shown in FIG. 15, the light-emitting elements 103 include main light-emitting elements 104 having three different emitted colors and backup light-emitting elements 105 having three different emitted colors. Light-emitting areas of the main light-emitting elements 104 having different emitted colors are the same. Light-emitting areas of the backup light-emitting elements 105 having different emitted colors are the same.

In a display unit 102, a red main light-emitting element 1041, a green main light-emitting element 1042, and a blue main light-emitting element 1043 are disposed, and a red backup light-emitting element 1051, a green backup light-emitting element 1052, and a blue backup light-emitting element 1053 are disposed correspondingly. Three backup light-emitting elements having different colors are disposed in two adjacent display units 103. Thus, there is space available where no backup light-emitting element 105 is disposed. In the first direction X1, the extension size of the light-emitting element of a backup light-emitting element 105 may be appropriately adjusted. When the light-emitting area of a backup light-emitting element 105 is greater than the light-emitting area of a main light-emitting element 104, the light-emitting area of a red main light-emitting element 1041, the light-emitting area of a green main light-emitting element 1042, and the light-emitting area of a blue main light-emitting element 1043 may also be configured to be the same, and the light-emitting area of a red backup light-emitting element 1051, the light-emitting area of a green backup light-emitting element 1052, and the light-emitting area of a blue backup light-emitting element 1053 are the same. In this manner, in the preparation process, the same drive voltage signal may be provided for main light-emitting elements 104 having the same light-emitting area or backup light-emitting elements 105 having the same light-emitting area, so that the wiring difficulty is reduced, and the space is saved, thereby reducing the preparation cost of the display panel 100.

In an embodiment, with continued reference to FIG. 15, in the first direction X, the size W5 of a backup light-emitting element 105 is greater than the size W6 of a main light-emitting element 104. In the second direction X2, the size W7 of the backup light-emitting element 105 is equal to the size W8 of the main light-emitting element 104. The first direction X1 intersects the second direction X2.

For example, the light-emitting elements 103 having different emitted colors are cyclically arranged in the first direction X1. The number of backup light-emitting elements 105 disposed is less than the number of main light-emitting elements 104 disposed. There is partial space available where no backup light-emitting element 105 is disposed. A space condition is provided for implementing that the light-emitting area of a backup light-emitting element 105 is greater than the light-emitting area of a main light-emitting element 104. Since in the first direction X1, there is an expandable space for the backup light-emitting element 105, in the first direction X1, the size of the backup light-emitting element 105 may be controlled to be greater than the size of the main light-emitting element 104. The first direction X1 and the second direction X2 are perpendicular to each other. Since in the second direction X2, there is no expandable space for the backup light-emitting element 105. Thus, in the second direction X2, the size of the backup light-emitting element 105 is equal to the size of the main light-emitting element 104. The space where no backup light-emitting element 105 is disposed is utilized only in the first direction X1, so that the preparation difficulty is reduced. Since when the backup light-emitting element 105 that starts working is relatively far away from the main light-emitting element 104 in which a dead pixel appears, the light-emitting area of the backup light-emitting element 105 is adjusted to be greater than the light-emitting area of the main light-emitting element 104. That is, the distance between the backup light-emitting element 105 and the main light-emitting element 104 that needs to be replaced is reduced. When multiple backup light-emitting elements 105 perform replacement display on the same main light-emitting element 104 in which the dead pixel appears, the replacement effect on the main light-emitting element 104 in which the dead pixel appears is ensured, and the display effect of the display panel 100 is ensured.

Figure 16:
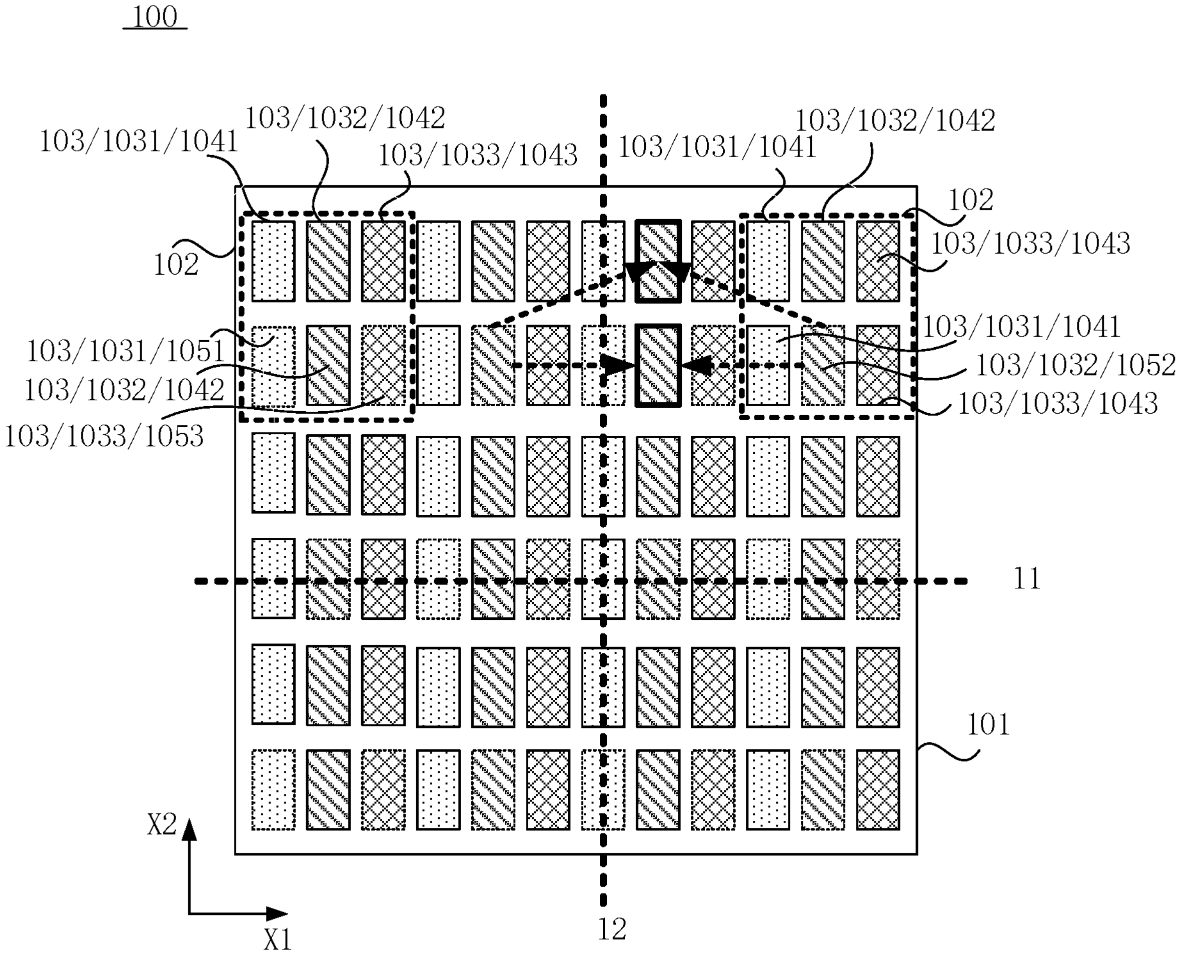
FIG. 16 is a diagram illustrating the structure of another display panel according to an embodiment of the present invention.

In an embodiment, FIG. 16 is a diagram illustrating the structure of another display panel according to an embodiment of the present invention. As shown in FIG. 16, a display unit 102 includes six light-emitting elements 103. The six light-emitting elements include two red light-emitting elements 1031, two green light-emitting elements 1032, and two blue light-emitting elements 1033. Sizes of the six light-emitting elements 103 are the same. One light-emitting element or two light-emitting elements having different colors of the six light-emitting elements are backup light-emitting elements.

The display panel 100 is provided with two red light-emitting elements 1031, two green light-emitting elements 1032, and two blue light-emitting elements 1033 of the same size. For example, as shown in FIG. 16, one display unit 102 includes six light-emitting elements 103. One of the six light-emitting elements 103 is configured to be a backup light-emitting element 105, and the other five light-emitting elements 103 are main light-emitting elements 104. As shown in FIG. 16, two red main light-emitting elements 1041, one green main light-emitting element 1042, two blue main light-emitting elements 1043, and one green backup light-emitting element 1052 are included. One display unit 102 includes six light-emitting elements 103. Two of the six light-emitting elements 103 are configured to be backup light-emitting elements 105, and the other four light-emitting elements 103 are main light-emitting elements 104. As shown in FIG. 16, one red main light-emitting element 1041, two green main light-emitting elements 1042, one blue main light-emitting element 1043, one red backup light-emitting element 1051, one green backup light-emitting element 1052, and one blue backup light-emitting element 1053 are included. That is, a main light-emitting element 104 is disposed in the space where no backup light-emitting element 105 is disposed. It is ensured that a backup light-emitting element 105 can perform display replacement when a dead pixel appears in a main light-emitting element 104. At the same time, the size of each main light-emitting element 104 and the size of each corresponding backup light-emitting element 105 are the same. In this manner, the brightness of the backup light-emitting element 105 can be ensured to be consistent with the brightness of the corresponding main light-emitting element 104 in which the dead pixel appears, and the display effect of the display panel 100 is ensured. At the same time, the transfer of the main light-emitting elements 104 and the backup light-emitting elements 105 is facilitated, so that the wiring difficulty is reduced, and the drive voltage is conveniently configured, thereby reducing the preparation cost. Further, the number of main light-emitting elements 104 disposed is increased, thereby further improving the display brightness of the display panel 100.

Figure 17:
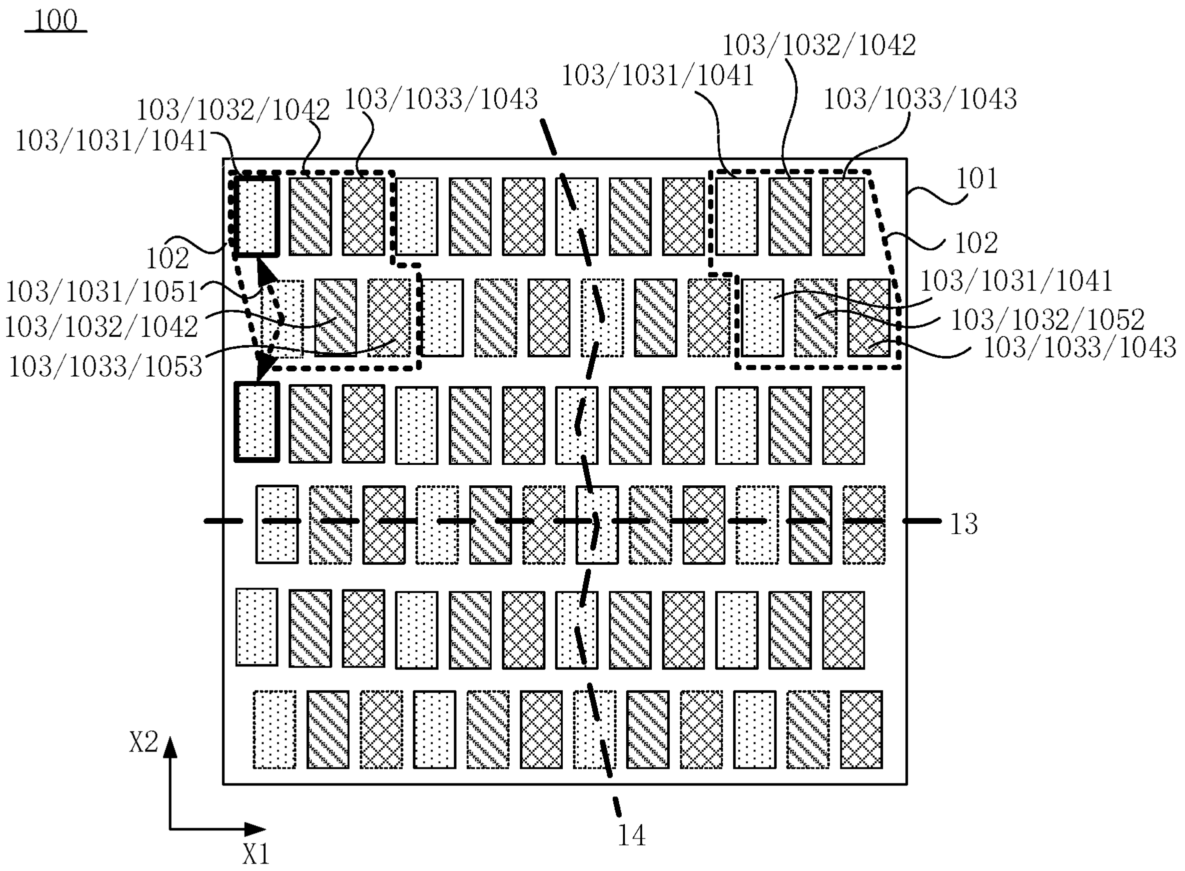
FIG. 17 is a diagram illustrating the structure of another display panel according to an embodiment of the present invention.

In an embodiment, FIG. 17 is a diagram illustrating the structure of another display panel 100 according to an embodiment of the present invention. As shown in FIG. 17, in the first direction X1 and the second direction X2, centers of light-emitting elements 103 are in a straight line.

Alternatively, at least in one of the first direction X1 or the second direction X2, the central connecting line of light-emitting elements 103 is polyline-shaped. The first direction X1 intersects the second direction X2.

For example, as shown in FIG. 16, in the first direction X1, light-emitting elements 103 having different emitted colors are cyclically arranged. The first direction X1 and the second direction X2 are perpendicular to each other. The center of each light-emitting element 103 can be located on a straight line in the first direction X1 and the second direction X2, such as straight line 11 and straight line 12 in FIG. 16. The light-emitting elements 103 have the same size, and the light-emitting elements 103 are arranged in an array. When the light-emitting elements 103 are micro light-emitting elements 103, the mass transfer difficulty of the light-emitting elements 103 is reduced, and the overall display effect of the display panel 100 is ensured. As shown in FIG. 17, in the first direction X1, light-emitting elements 103 having different emitted colors are cyclically arranged. A main light-emitting element 104 is disposed in partial space where no backup light-emitting element 105 is disposed. In this manner, the number of main light-emitting elements 104 disposed is greater than the number of backup light-emitting elements 105 disposed, so that the display brightness of the display panel 100 is improved. At the same time, in the first direction X1, the center of each light-emitting element 103 is located in a straight line, for example, straight line 13 in FIG. 17. In the second direction X2, the central connecting line of light-emitting elements 103 is polyline-shaped, for example, straight line 14 in FIG. 17. The light-emitting elements 103 between adjacent rows are staggered to distinguish a main light-emitting element 104 row from a backup light-emitting element 105 row. Thus, when a main light-emitting element 104 fails or is damaged, a backup light-emitting element 105 is quickly selected to perform display compensation on the main light-emitting element 104, so that the display compensation effect is ensured. At the same time, the backup light-emitting element 105 is multiplexed, so that the number of backup light-emitting elements 105 arranged may be reduced, the number of main light-emitting elements 104 arranged is increased, and the display effect of the display panel 100 is improved.

Figure 18:
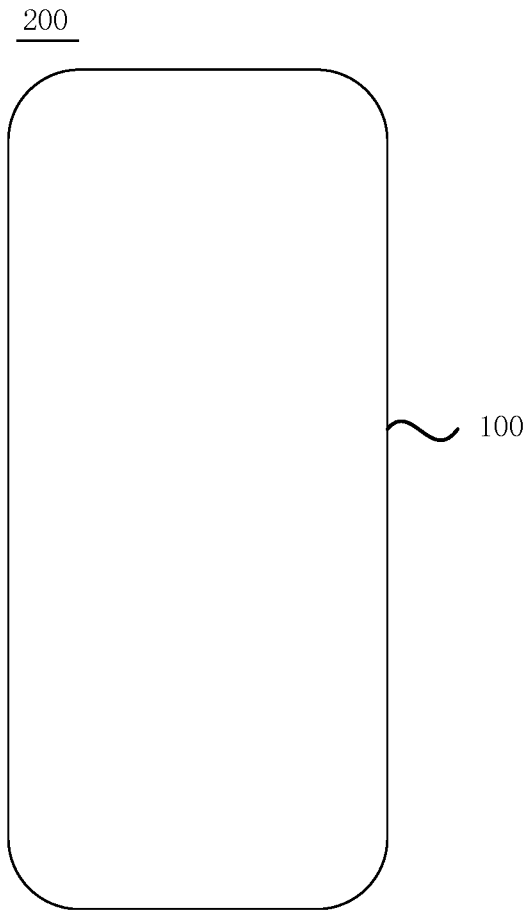
FIG. 18 is a view illustrating the structure of a display device according to an embodiment of the present invention.

FIG. 18 is a view illustrating the structure of a display device according to an embodiment of the present invention. As shown in FIG. 18, the display device 200 includes the display panel 100 according to the preceding embodiments.

It is to be noted that since the display device provided by this embodiment has the same or corresponding beneficial effects as the display panel 100 according to the preceding embodiments, the details are not repeated here. The display device 200 provided in the embodiment of the present invention may be the phone shown in FIG. 18, or may be any electronic product with the display function, including but not limited to the following categories: a television, a laptop, a desktop display, a tablet computer, a digital camera, a smart bracelet, smart glasses, a vehicle-mounted display, a medical device, an industrial control device, and a touch interactive terminal, and no special limitations are made thereto in the embodiment of the present invention.

The preceding embodiments do not limit the scope of the present invention. It is to be understood by those skilled in the art that various modifications, combinations, sub-combinations, and substitutions may be performed according to design requirements and other factors. Any modifications, equivalent substitutions, and improvements made within the spirit and principle of the present invention are within the scope of the present invention.

What is claimed is:

1. A display panel, comprising:

a substrate; and a plurality of display units located on a side of the substrate, wherein each of the plurality of display units comprises a plurality of light-emitting elements, the plurality of light-emitting elements comprises main light-emitting elements and backup light-emitting elements, and a number of the main light-emitting elements is greater than a number of the backup light-emitting elements; and the main light-emitting elements are arranged in a first direction, one of the backup light-emitting elements is located between two main light-emitting elements of the main light-emitting elements in a second direction, and in the second direction, at least two of the main light-emitting elements are disposed adjacent to each other;

wherein at least part of the plurality of display units each comprise two backup light-emitting elements having different emitted colors;

wherein when a dead pixel appears in a main light-emitting element of the main light-emitting elements, no backup light-emitting element having the same emitted color as the main light-emitting element is disposed at a position adjacent to the main light-emitting element, at least two of the backup light-emitting elements within a preset radius centered on the main light-emitting element in which the dead pixel appears emit light.

2. The display panel according to claim 1, wherein the at least two backup light-emitting elements within the preset radius centered on the one main light-emitting element in which the dead pixel appears are disposed symmetrically with respect to an axis of the main light-emitting element in which the dead pixel appears.

3. The display panel according to claim 1, wherein each of the plurality of display units comprises main light-emitting elements having three different emitted colors, and wherein an emitted color of a backup light-emitting element of the two backup light-emitting elements is the same as an emitted color of a main light-emitting element of the three main light-emitting elements, and two adjacent display units of the plurality of display units comprise backup light-emitting elements of the backup light-emitting elements having three different emitted colors.

4. The display panel according to claim 2, wherein the main light-emitting elements comprise red main light-emitting elements, green main light-emitting elements, and blue main light-emitting elements, and the backup light-emitting elements comprise red backup light-emitting elements, green backup light-emitting elements, and blue backup light-emitting elements;

each display unit comprises one of the red main light-emitting elements, one of the green main light-emitting elements, one of the blue main light-emitting elements, and one or two of one of the red backup light-emitting elements, one of the green backup light-emitting elements, and one of the blue backup light-emitting elements; and in the first direction, the main light-emitting elements having three emitted colors are cyclically arranged, and the backup light-emitting elements having three emitted colors are cyclically arranged; and in the second direction, emitted colors of two adjacent light-emitting elements of the plurality of light-emitting elements are the same, wherein the first direction intersects the second direction, and the two adjacent light-emitting elements in the second direction comprise two adjacent ones of the main light-emitting elements or comprise one of the backup light-emitting elements and one of the main light-emitting elements.

5. The display panel according to claim 1, wherein the main light-emitting elements comprise first main light-emitting elements, and a light-emitting area of each of the first main light-emitting elements is greater than a light-emitting area of each of the backup light-emitting elements, wherein the plurality of light-emitting elements is arranged in the first direction and the second direction, the first direction intersects the second direction, and in the first direction or the second direction, a projection of a backup light-emitting element of the backup light-emitting elements at least partially overlaps a projection of at least one adjacent first main light-emitting element of the first main light-emitting elements.

6. The display panel according to claim 5, wherein the plurality of light-emitting elements comprises the first main light-emitting elements having three different emitted colors and the backup light-emitting elements having three different emitted colors, light-emitting areas of the backup light-emitting elements having the different emitted colors are the same, and a light-emitting area of a first main light-emitting element having at least one light-emitting color of the three different emitted colors is larger than a light-emitting area of a backup light-emitting element of the backup light-emitting elements.

7. The display panel according to claim 5, wherein in the first direction or the second direction, a backup light-emitting element of the backup light-emitting elements partially overlaps projections of two adjacent first main light-emitting elements of the first main light-emitting elements having different emitted colors.

8. The display panel according to claim 6, wherein light-emitting areas of the first light-emitting elements having the different emitted colors are the same.

9. The display panel according to claim 5, the main light-emitting elements comprise red main light-emitting elements, green main light-emitting elements, and blue main light-emitting elements, and a light-emitting area S1 of each of the red main light-emitting elements, a light-emitting area S2 of each of the green main light-emitting elements, and a light-emitting area S3 of each of the blue main light-emitting elements satisfy $S1>S2>S3$.

10. The display panel according to claim 5, wherein the main light-emitting elements comprise red main light-emitting elements, green main light-emitting elements, and blue main light-emitting elements, and a light-emitting area S1 of each of the red main light-emitting elements, a light-emitting area S2 of each of the green main light-emitting elements, and a light-emitting area S3 of each of the blue main light-emitting elements satisfy $S1>S2=S3$.

11. The display panel according to claim 10, wherein the light-emitting area of each green main light-emitting element is the same as the area of each backup light-emitting element.

12. The display panel according to claim 5, wherein in the second direction, a size of a main light-emitting element of the main light-emitting elements is greater than a size of a backup light-emitting element of the backup light-emitting elements; in the first direction, a size of the main light-emitting element is equal to a size of the backup light-emitting element; and the first direction intersects the second direction.

13. The display panel according to claim 1, wherein a light-emitting area of each of at least part of the backup light-emitting elements is greater than a light-emitting area of each of the main light-emitting elements.

14. The display panel according to claim 13, wherein the plurality of light-emitting elements comprises the main light-emitting elements having three different emitted colors and the backup light-emitting elements having three different emitted colors, the light-emitting areas of the main light-emitting elements having the different emitted colors are the same, and light-emitting areas of the backup light-emitting elements having the different emitted colors are the same.

15. The display panel according to claim 14, wherein in the first direction, a size of a backup light-emitting element of the backup light-emitting elements is greater than a size of a main light-emitting element of the main light-emitting elements; in the second direction, a size of the backup light-emitting element is equal to a size of the main light-emitting element;

and the first direction intersects the second direction.

16. The display panel according to claim 1, wherein each of the plurality of display units comprises six light-emitting elements, the six light-emitting elements comprise two red light-emitting elements, two green light-emitting elements, and two blue light-emitting elements, and sizes of the six light-emitting elements are the same, wherein one light-emitting element or two light-emitting elements having different colors of the six light-emitting elements are backup light-emitting elements of the backup light-emitting elements.

17. The display panel according to claim 16, wherein in the first direction and the second direction, centers of light-emitting elements of the plurality of light-emitting elements are in a straight line; or at least in one of the first direction or the second direction, a central connecting line of light-emitting elements of the plurality of light-emitting elements is polyline-shaped, and the first direction intersects the second direction.

18. The display panel according to claim 1, wherein the plurality of light-emitting elements comprises organic light-emitting diodes, sub-millimeter light-emitting diodes, or micro light-emitting diodes.

19. A display device, comprising a display panel, wherein the display panel comprises:

a substrate; and a plurality of display units located on a side of the substrate, wherein each of the plurality of display units comprises a plurality of light-emitting elements, the plurality of light-emitting elements comprises main light-emitting elements and backup light-emitting elements, and a number of the main light-emitting elements is greater than a number of the backup light-emitting elements; and the main light-emitting elements are arranged in a first direction, one of the backup light-emitting elements is located between two main light-emitting elements of the main light-emitting elements in a second direction, and in the second direction, at least two of the main light-emitting elements are disposed adjacent to each other;

wherein at least part of the plurality of display units each comprise two backup light-emitting elements having different emitted colors;

wherein when a dead pixel appears in a main light-emitting element of the main light-emitting elements, no backup light-emitting element having the same emitted color as the main light-emitting element is disposed at a position adjacent to the main light-emitting element, at least two of the backup light-emitting elements within a preset radius centered on the main light-emitting element in which the dead pixel appears emit light.

* * * * *